(12) United States Patent
Sato et al.

(10) Patent No.: US 10,164,174 B2
(45) Date of Patent: Dec. 25, 2018

(54) MAGNETORESISTANCE EFFECT ELEMENT AND MAGNETIC MEMORY

(71) Applicant: TOHOKU UNIVERSITY, Sendai-shi, Miyagi (JP)

(72) Inventors: Hideo Sato, Sendai (JP); Shoji Ikeda, Sendai (JP); Mathias Bersweiler, Sendai (JP); Hiroaki Honjo, Sendai (JP); Kyota Watanabe, Sendai (JP); Shunsuke Fukami, Sendai (JP); Fumihiro Matsukura, Sendai (JP); Kenchi Ito, Sendai (JP); Masaaki Niwa, Sendai (JP); Tetsuo Endoh, Sendai (JP); Hideo Ohno, Sendai (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 15/872,922

(22) Filed: Jan. 16, 2018

(65) Prior Publication Data

US 2018/0175286 A1 Jun. 21, 2018

Related U.S. Application Data

(63) Continuation of application No. PCT/JP2016/070850, filed on Jul. 14, 2016.

(30) Foreign Application Priority Data

Jul. 16, 2015 (JP) ................................ 2015-155481

(51) Int. Cl.
*H01L 43/08* (2006.01)
*H01F 10/16* (2006.01)
(Continued)

(52) U.S. Cl.
CPC ............ *H01L 43/08* (2013.01); *G11C 11/161* (2013.01); *H01F 10/16* (2013.01); *H01F 10/32* (2013.01);
(Continued)

(58) Field of Classification Search
CPC ......... H01L 43/08; H01L 43/10; H01L 27/22; H01L 27/105; H01L 27/222; H01L 29/82;
(Continued)

(56) References Cited

U.S. PATENT DOCUMENTS 8,680,633 B1   3/2014   Kato et al.
8,878,324 B2   11/2014  Kato et al.
(Continued)

FOREIGN PATENT DOCUMENTS

JP   2007-504651 A   3/2007
JP   2008-028362 A   2/2008
(Continued)

OTHER PUBLICATIONS

N. Nishimura et al., "Magnetic tunnel junction device with perpendicular magnetization films for high-density magnetic random access memory", Journal of Applied Physics, vol. 91, No. 8. pp. 5246-5249, Apr. 15, 2002.
(Continued)

*Primary Examiner* — A. Sefer
(74) *Attorney, Agent, or Firm* — Rabin & Berdo, P.C.

(57) ABSTRACT

A magnetoresistance effect element includes first and second magnetic layers having a perpendicular magnetization direction, and a first non-magnetic layer disposed adjacent to the first magnetic layer and on a side opposite to a side on which the second magnetic layer is disposed. An interfacial perpendicular magnetic anisotropy exists at an interface between the first magnetic layer and the first non-magnetic layer, and the anisotropy causes the first magnetic layer to
(Continued)

have a magnetization direction perpendicular to the surface if the layers. The second magnetic layer has a saturation magnetization lower than that of the first magnetic layer, and an interfacial magnetic anisotropy energy density ($K_i$) at the interface between the first magnetic layer and the first non-magnetic layer is greater than that of an interface between the first non-magnetic layer and second magnetic layers if being disposed adjacent each other.

25 Claims, 15 Drawing Sheets

(51) Int. Cl.
| | |
|---|---|
| H01F 10/32 | (2006.01) |
| H01L 27/105 | (2006.01) |
| H01L 29/82 | (2006.01) |
| G11C 11/16 | (2006.01) |
| H01L 27/22 | (2006.01) |
| H01L 43/10 | (2006.01) |

(52) U.S. Cl.
CPC ..... *H01F 10/3254* (2013.01); *H01F 10/3286* (2013.01); *H01L 27/105* (2013.01); *H01L 27/222* (2013.01); *H01L 29/82* (2013.01); *H01L 43/10* (2013.01)

(58) Field of Classification Search
CPC ....... G11C 11/16; G11C 11/161; H01F 10/32; H01F 10/3254; H01F 10/3286
See application file for complete search history.

(56) References Cited

U.S. PATENT DOCUMENTS

| | | |
|---|---|---|
| 2005/0045913 A1 | 3/2005 | Nguyen et al. |
| 2007/0297220 A1 | 12/2007 | Yoshikawa et al. |
| 2008/0253174 A1 | 10/2008 | Yoshikawa et al. |
| 2009/0243008 A1 | 10/2009 | Kitagawa et al. |
| 2013/0140658 A1* | 6/2013 | Yamane ............... H01L 29/82 257/421 |
| 2013/0141964 A1 | 6/2013 | Yamane et al. |
| 2014/0169087 A1 | 6/2014 | Yamane et al. |
| 2014/0264669 A1* | 9/2014 | Nakayama ............ H01L 43/10 257/421 |
| 2015/0303375 A1 | 10/2015 | Yamane et al. |

FOREIGN PATENT DOCUMENTS

| | | |
|---|---|---|
| JP | 2008-252018 A | 10/2008 |
| JP | 2009-239120 A | 10/2009 |
| JP | 2011-258596 A | 12/2011 |
| JP | 2013-115400 A | 6/2013 |
| JP | 2014-063886 A | 4/2014 |

OTHER PUBLICATIONS

G. Kim et al., "Tunneling magnetoresistance of magnetic tunnel junctions using perpendicular magnetization $L1_0$-CoPt electrodes", Applied Physics Letters, vol. 92, pp. 172502-1-172502-3, 2008.

K. Mizunuma et al., "MgO barrier-perpendicular magnetic tunnel junctions with CoFe/Pd multilayers and ferromagnetic insertion layers", Applied Physics Letters, vol. 95, pp. 232516-1-232516-3, Dec. 11, 2009.

S. Ikeda et al., "A perpendicular-anisotropy CoFeB—MgO magnetic tunnel junction", Nature Materials, vol. 9, pp. 721-724, Jul. 11, 2010.

H. Sato et al., "Perpendicular-anisotropy CoFeB—MgO magnetic tunnel junctions with a MgO/CoFeB/Ta/CoFeB/MgO recording structure", Applied Physics Letters, vol. 101, pp. 022414-1-022414-4, Jul. 13, 2012.

H. Sato et al., "MgO/CoFeB/Ta/CoFeB/MgO Recording Structure in Magnetic Tunnel Junctions with Perpendicular Easy Axis", IEEE Transactions on Magnetics, vol. 49, No. 7, pp. 4437-4440, Jul. 2013.

H. Sato et al., "Comprehensive study of CoFeB-MgO magnetic tunnel junction characteristics with single- and double-interface scaling down to 1x nm", IEEE Electron Devices Meet, pp. 3.2.1-3.2.4, 2013.

S. Ikeda et al., "Boron Composition Dependence of Magnetic Anisotropy and Tunnel Magnetoresistance in MgO/CoFe(B) Based Stack Structures", IEEE Transactions on Magnetics, vol. 48, No. 11, pp. 3829-3832, Nov. 2012.

* cited by examiner

Sub./Ta(5)/MgO(1.0)/(Co0.25Fe0.75)100-xBx(t)/Ta(5)/Ru(5)

MAGNETORESISTANCE EFFECT ELEMENT AND MAGNETIC MEMORY

CROSS-REFERENCE TO RELATED APPLICATIONS

This application is a continuation application under 35 U.S.C. 120 of International Application PCT/JP2016/70850 having the International Filing Date of Jul. 14, 2016, and claims the priority of Japanese Patent Application No. JP 2015-155481, filed on Jul. 16, 2015. The identified applications are fully incorporated herein by reference.

BACKGROUND OF THE INVENTION

Technical Field

The present invention relates to a magnetoresistance effect element and a magnetic memory.

Background Arts

As shown in FIG. 14, in a conventional magnetic random access memory (MRAM) having a magnetoresistance effect element, a magnetic memory cell (105) has the structure in which a magnetoresistance effect element (110) and a select transistor (109) are electrically connected to each other in series. In the select transistor 109, the source electrode is electrically connected to a source line (102), the drain electrode is electrically connected to a bit line (104) via the magnetoresistance effect element (110), and the gate electrode is electrically connected to a word line (103). The magnetoresistance effect element (110) generally has a three-layer structure in which a first non-magnetic layer (113) is sandwiched between a sixth magnetic layer (111) (reference layer) and a first magnetic layer (112). The resistance value of the magnetoresistance effect element (110) decreases when the magnetization of the sixth magnetic layer (111) (reference layer) is parallel to the magnetization of the first magnetic layer (112), and increases when the magnetization of the sixth magnetic layer (111) (reference layer) is anti-parallel to the magnetization of the first magnetic layer (112). In the memory cell of MRAM, those two resistance states are assigned to "0" and "1" of the bit information respectively.

Due to the higher integration of the MRAM, the magnetoresistance effect element (110) has been increasingly made compact. The sixth magnetic layer (111) (reference layer) and the first magnetic layer (112) of the magnetoresistance effect element (110) are both susceptible to thermal disturbance of magnetization during microfabrication, which possibly causes loss of bit information. In order to keep the bit information even with microfabrication, the first magnetic layer (112), which is the recording layer, needs to have the thermal stability index ($E/k_B$ T) of 70 or higher, and the sixth magnetic layer (111), which is the reference layer, needs to have the thermal stability index ($E/k_B$ T) that is greater than that of the first magnetic layer (112). Here, E is the energy barrier required for the magnetization reversal, and is the product of the volume V and the magnetic anisotropy energy density $K_{eff}$ of the sixth magnetic layer (111) (reference layer) or the first magnetic layer (112) ($E=K_{eff}V$). $k_B$ is the Boltzmann constant, and T is the absolute temperature.

In order to achieve a high thermal stability index $E/k_B$ T, it is necessary to increase the effective magnetic anisotropy energy density $K_{eff}$ of the sixth magnetic layer (111) (reference layer) or the first magnetic layer (112). From this perspective, a perpendicular magnetic anisotropy magnetoresistance effect element in which the sixth magnetic layer (111) (reference layer) or the first magnetic layer (112) has the perpendicular magnetization easy axis is drawing attention. For such a perpendicular magnetic anisotropy electrode, a rare earth group amorphous alloy, an $L1_0$-ordered (Co, Fe)—Pt alloy, a Co/(Pd, Pt) multilayer film, and the like have been studied (see N. Nishimura, T. Hirai, A. Koganei, T. Ikeda, K. Okano, Y. Sekiguchi, and Y. Osada, "Magnetic tunnel junction device with perpendicular magnetization films for high-density magnetic random access memory", J. Appl. Phys. 2002, 91, 5246 (Non-patent Document 1), G. Kim, Y. Sakuraba, M. Oogane, Y. Ando and T. Miyazaki, "Tunneling magnetoresistance of magnetic tunnel junctions using perpendicular magnetization L10-CoPt electrodes", Appl. Phys. Lett. 2008, 92, 172502 (Non-patent Document 2), or K. Mizunuma, S. Ikeda, J. H. Park, H. Yamamoto, H. D. Gan, K. Miura, H. Hasegawa, J. Hayakawa, F. Matsukura and H. Ohno, "MgO barrier-perpendicular magnetic tunnel junctions with CoFe/Pd multilayers and ferromagnetic insertion layers", Appl. Phys. Lett. 2009, 95, 232516 (Non-patent Document 3), for example).

The inventors of the present invention and the like have discovered that a CoFeB/MgO multi-layer structure exhibits the perpendicular magnetic anisotropy due to reduction of the film thickness of CoFeB (see Japanese Patent Application Laid-open Publication No. 2011-258596, for example), and by applying this CoFeB/MgO multiplayer structure to the perpendicular magnetic anisotropic magnetoresistance effect element, $E/k_B$ T≈40 is obtained with the junction size diameter being 40 nm in the first magnetic layer (112), which is the recording layer (see Ikeda, K. Miura, H. Yamamoto, K. Mizunuma, H. D. Gan, M. Endo, S. Kanai, F. Matsukura, and H. Ohno, "A perpendicular-anisotropy CoFeB—MgO magnetic tunnel junction", Nature Mater., 2010, 9, 721 (Non-patent Document 4), for example. Furthermore, by employing the double CoFeb/MgO interface recording layer structure, and making the magnetic layer that functions as the recording layer thicker so that the thermal stability is improved, $E/k_B$ T of 80 or higher is achieved when the junction size diameter is between 40 to 49 nm, and $E/k_B$ T≈59 is achieved when the junction size diameter is 29 nm (see H. Sato, M. Yamanouchi, S. Ikeda, S. Fukami, F. Matsukura, and H. Ohno, "MgO/CoFeB/Ta/CoFeB/MgO recording structure in magnetic tunnel junctions with perpendicular easy axis", IEEE Trans. Magn., 2013, 49, 4437 (Non-patent Document 6), for example).

Here, the junction size of the magnetic layer is the length of the longest straight line on the junction surface where the magnetic layer makes contact with an adjacent non-magnetic layer or electrode. In Non-patent Documents 4 and 5, the magnetic layer forms the cylindrical shape, and the junction surface is in a circle shape, and therefore, the junction size is the diameter of the junction surface. The junction size when the junction surface is in a circular shape is referred to as the junction size diameter.

As shown in FIG. 15A, the perpendicular magnetic anisotropic magnetoresistance effect element of Non-patent Document 4 has the basic structure in which the sixth magnetic layer (111) (reference layer), the first magnetic layer (112), and the first non-magnetic layer (113) interposed therebetween forms the three-layer structure, and a lower non-magnetic electrode (114) and an upper non-magnetic electrode (115) are connected to the three-layer structure.

Also, as shown in FIG. 15B, in the perpendicular magnetic anisotropic magnetoresistance effect element described in H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett. 2012, 101, 022414 (Non-patent Document 5), a non-magnetic layer (113), the first magnetic layer (112), the third non-magnetic layer (116), the third magnetic layer (117), and the second non-magnetic layer (118) are stacked in this order, forming a five-layer structure. The interface magnetic anisotropy occurs between the third magnetic layer (117) and the second non-magnetic layer (118). Non-patent Document 5 states that the thermal stability can be improved with this five-layer structure. The first magnetic layer (112) and the third magnetic layer (117) forms magnetic coupling through the third non-magnetic layer (116), and functions as the recording layer (119).

In FIG. 15C, the leakage flux from the sixth magnetic layer (111) (reference layer) affects the recording layer (119), and lowers the thermal stability of the anti-parallel magnetization array of the sixth magnetic layer (111) (reference layer) and the recording layer (119). In order to solve this problem, the perpendicular magnetic anisotropic magnetoresistance effect element according to H. Sato, T. Yamamoto, M. Yamanouchi, S. Ikeda, S. Fukami, K.Kinoshita, F. Matsukura, N. Kasai, and H. Ohno, "Comprehensive study of CoFeB—MgO magnetic tunnel junction characteristics with single- and double-interface scaling down to 1× nm", Tech. Dig.-Int. Electron Devices Meet. 2013, 3.2.1 (Non-patent Document 7) has the first reference layer (124) in which the sixth magnetic layer (111) (reference layer) and the seventh magnetic layer (120) forms ferromagnetic coupling through the fourth non-magnetic layer (121), and the part with the ferromagnetic coupling and the eighth magnetic layer (122) are arranged to be anti-parallel through the fifth non-magnetic layer (123). With this antiparallel coupling reference layer, the leakage flux acting on the first recording layer (119) from the first reference layer (124) can be reduced, and the thermal stability of the antiparallel magnetic array of the sixth magnetic layer (111) (reference layer) and the first recording layer (119) can be improved.

SUMMARY OF THE INVENTION

In order to realize a highly-integrated large-capacity magnetic memory, it is necessary to have non-volatility that allows the recorded bit information to be stored for 10 years. This requires the magnetic layer used for the recording layer to have the thermal stability index of at least 70. In the perpendicular magnetic anisotropy magnetoresistance effect element according to Non-patent Document 4, when the junction size diameter of the recording layer is 40 nm, the thermal stability index is about 40, which means that the thermal stability index is no greater than 70. In the perpendicular magnetic anisotropy magnetoresistance effect element according to Non-patent Document 5, when the junction size diameter of the recording layer is between 40 nm and 49 nm, the thermal stability index is at least 80, but when the junction size diameter is 29 nm, the thermal stability index is about 59, which means that the thermal stability index is no greater than 70. In the perpendicular magnetic anisotropy magnetoresistance effect element using the anti-parallel coupling reference layer according to Non-patent Document 7, when the junction size diameter of the recording layer is between 30 nm and 39 nm, the thermal stability index is at least 90, but when the junction size diameter is 20 nm, the thermal stability index is about 58, which means that the thermal stability index is no greater than 70. In order to achieve a large capacity magnetic memory that is highly integrated by microfabrication, it was necessary to further improve the thermal stability of the recording layer with a very small junction size.

Also, among the characteristics (high tunnel magnetic resistance (TMR) ratio, low writing current $I_{C0}$, and high thermal stability) required for the interface between a magnetic layer and a non-magnetic layer of a perpendicular magnetic anisotropic magnetoresistance effect element that is used for a large capacity magnetic memory that is highly integrated by microfabrication, the writing current $I_{C0}$ is determined by the damping constant $\alpha$, and therefore, it was necessary to keep the damping constant $\alpha$ no greater than 0.01.

The present invention was made in view of those challenges, and is aiming at providing a magnetoresistance effect element and magnetic memory having a thermal stability index of at least 70 even with a very small function size.

The present invention is also aiming at providing a magnetoresistance effect element and magnetic memory having a damping constant $\alpha$ being 0.01 or less, and an interfacial magnetic anisotropy energy density 2.6 mJ/m$^2$ or more even with a very small junction size.

In order to achieve a high thermal stability in a magnetoresistance effect element, the inventors of the present invention have conducted a study based on the following principle. That is, in the thermal stability index $E/k_B T$ of a ferromagnetic layer that functions as the recording layer, which determines the storing capability for bit information of a magnetoresistance effect element, the energy barrier E is represented by the product of the effective magnetic anisotropy energy density $K_{ea}$ and the volume V (area S×recording layer thickness t) of the recording layer. In the coordinates with the x axis and y axis being in the plane and the z axis being in the perpendicular direction to the plane, the product of the effective magnetic anisotropy energy density $K_{eff}$ and the recording layer thickness t is represented with Formula 1 below.

$$K_{eff} t = K_i - \left[ (N_z - N_x) \frac{M_s^2}{2\mu_0} + K_b \right] t \qquad \text{Formula 1}$$

In Formula 1, $K_b$ is the bulk magnetic anisotropy energy density due to the crystal magnetic anisotropy and magnetoelastic effect, Nz and Nx are the antimagnetic field coefficients of the z axis and x axis respectively, $M_s$ is the saturation magnetization of the recording layer, $\mu_0$ is the permeability of vacuum, and $K_i$ is the interfacial magnetic anisotropy energy density. $N_x$ is equal to the demagnetizing field coefficient $N_y$ of the y axis. $N_z$ and $N_x$ are difficult to obtain strictly when the recording layer is a circular cylinder, and can be obtained by numerical calculation using an ellipse approximation. When $K_{eff} t$ is positive, it becomes the easy magnetization axis in the direction perpendicular to the plane.

As described in Non-patent Document 7, in the CoFe(B)/MgO junction, the interfacial magnetic anisotropy energy density $K_i$ is induced at the interface between CoFeB and MgO, thereby obtaining the perpendicular magnetic anisotropy ($K_{eff}$>0). However, when CoFeB is used as a ferromagnetic layer in contact with MgO to obtain the interfacial magnetic anisotropy energy density $K_i$, the interfacial magnetic anisotropy energy density $K_i$ will be lower as compared to when CoFe that does not contain B is used. When CoFe not containing B is in contact with MgO, a higher interfacial magnetic anisotropy energy density $K_i$ can be obtained, but since CoFe has a higher saturation magnetization Ms than that of CoFeB, the demagnetizing field $(-(N_z-N_x)M_s/2\infty0)$ is larger, and because the in-plane magnetic anisotropy is ($K_{eff}<0$), the perpendicular magnetic anisotropy cannot be obtained.

As for the writing current $I_{C0}$ of the spin injection magnetization reversal and the thermal stability index $\Delta(=E/k_BT)$ in the perpendicular magnetic anisotropic magnetic tunnel junction (p-MTJ), the relationship of the following formula is known.

$$I_{C0} = 4\alpha \frac{ek_BT}{\hbar P}\Delta = 4\alpha \frac{e}{\hbar P}K_{eff}tS \quad \text{[Formula 2]}$$

$$\Delta = \frac{K_{eff}tS}{k_BT} \quad \text{[Formula 3]}$$

$\alpha$ is the damping constant, e is the elementary charge, h is the Dirac constant, P is the spin polarizability, and S is the junction area.

In order to keep the thermal stability index $\Delta$ high and the writing current $I_{C0}$ low, it is necessary to form the recording layer with high $K_{eff}t$ and low damping constant $\alpha$. The dumping constant $\alpha$ and $K_{eff}t$ has the following relationship (Table 1)

TABLE 1

| | $K_{eff}t$ (Product of Effective Magnetic Anisotropy Energy Density and Recording Layer Thickness) | | | |
|---|---|---|---|---|
| | $K_i$ (Interfacial magnetic anisotropy energy density) | $-((N_z-N_x)$ $M_s^2/2\mu_0)t$ | $K_b$ (Bulk Magnetic Anisotropy Energy Density) | |
| | | | K Crystal Magnetic Anisotropy Energy Density | K Magnetoelastic Energy Density |
| $\alpha$ (Damping Constant) | Correlated | No correlation between Ms (saturation magnetization) and $\alpha$ (damping constant) when the material base is changed. | Correlated with the same material base | — |

Furthermore, in order to satisfy a high tunnel magnetic resistance (TMR) ratio at the same time, it is preferable that the barrier layer in the MTJ (magnetic tunnel junction) be made of MgO.

In order to achieve high $K_{eff}t$ while keeping the damping constant $\alpha$ at a low level, it is necessary to lower the saturation magnetization Ms so that the interfacial magnetic anisotropy energy density $K_i$ at the interface between CoFe (B) and MgO is not reduced.

The inventors of the present invention have arrived at the magnetoresistance effect element and magnetic memory including a recording layer with reduced Ms so that the interfacial magnetic anisotropy energy density $K_i$ is not reduced.

That is, in the recording layer of the magnetoresistance effect element of the present invention, parts in contact with a non-magnetic layer are made of a magnetic material that achieves a high interfacial magnetic anisotropy energy density $K_i$ to keep the damping constant $\alpha$ at a low level, and parts not in contact with a non-magnetic layer are made of a material with low saturation magnetization Ms so as to increase $K_{eff}t$.

According to the magnetoresistance effect element and the magnetic memory of the present invention, it is possible to provide a magnetoresistance effect element and a magnetic memory that has a recording layer with a low damping constant $\alpha$ and high thermal stability even with a very small junction size.

FIG. 2A shows the dependency of the saturation magnetization $M_s$ of a CoFe (B)/MgO multilayer film on B (0 to 25 at %) composition. This B composition is the target composition, and the composition of B in the film varies from 0 to 33 at %. As the B composition decreases, the saturation magnetization $M_s$ increases.

FIG. 2B shows the B composition dependency of the interfacial magnetic anisotropy energy density $K_i$ generated at the interface between CoFe (B) and MgO on the B composition, and the interfacial magnetic anisotropy energy density $K_i$ increases as the B composition decreases.

As a result, $K_{eff}t$ i.e., $\Delta(=K_{eff}tS/k_BT)$ is determined by the trade-off relationship between $K_i$ and diamagnetic field $(-M_s^2/2\mu_0)$. In the magnetization measurement, the blanket film is measured, and therefore, the diamagnetic field coefficient is $N_z-N_x=1$.

According to Non-Patent Document 4, the interfacial magnetic anisotropy energy density $K_i$ at a CoFeB/MgO single interface is 1.3 mJ/m², and by having a double CoFeB—MgO interface, the interfacial magnetic anisotropy energy density $K_i$ is ideally $2K_i=2.6$ mJ/m², which is twofold of the single interface. On the other hand, according to S. Ikeda, R. Koizumi, H. Sato, M. Yamanouchi, K. Miura, K. Mizunuma, H. D. Gan, F. Matsukura, and H. Ohno, "Boron Composition Dependence of Magnetic Anisotropy and Tunnel Magnetoresistance in MgO/CoFe(B) Based Stack Structures", IEEE Trans. Magn., 2012, 48, 3829 (Non-patent Document 8), the interfacial magnetic anisotropy energy density $K_i$ at a CoFeB/MgO single interface is 1.8 mJ/m², and by having a double interface, the interfacial magnetic anisotropy energy density $K_i$ is ideally $2K_i=3.6$ mJ/m². FIG. 3 shows the thermal stability index $E/k_BT$ (=$\Delta$) calculated with Formula 1 and Formula 2 when the CoFe/MgO double interface structure is employed, and the overall saturation magnetization Ms was changed by inserting CoFeB in the middle. The overall thickness of the recording layer of CoFe and CoFeB was 2.6 nm. With the MgO/CoFe/CoFeB/CoFe/MgO structure, it is possible to achieve higher $E/k_B T$ than the conventional MgO/CoFe/Ta/CoFe/MgO structure described in Non-patent Documents 5 to 7. As shown in Table 2, when the saturation magnetization Ms of the MgO/CoFe/CoFeB/CoFe/MgO recording layer is set to 1.5 T, the thermal stability index of over 100 is achieved with the 20 nm-diameter MTJ (magnetic tunnel junction). The saturation magnetization Ms of the MgO/CoFe/CoFeB/CoFe/MgO structure can be adjusted by changing the composition and thickness of CoFe and CoFeB.

In order to maintain consistency between FIG. 1 and FIG. 4, the ordinal numbers such as "first, second, . . . " are commonly used.

The magnetoresistance effect element of the present invention shown in FIG. 1A has the following features:

The magnetoresistance effect element has a multi-layer structure made of a first non-magnetic layer (13), a first magnetic layer (25) and a second magnetic layer (12). The first magnetic layer (25) is formed on the first non-magnetic layer (13) and has the function of increasing the interface magnetic anisotropy energy density ($K_i$) at the interface with

TABLE 2

| F (nm) | S (m2) | t* (nm) | kB | T (K) | Ms (T) | Ki (J/m^2) | 2Ki (J/m^2) | Nz | Nx | (Nz − Nx) * Ms2/2u0 (J/m^3) | Kb (J/m^3) | Delta |
|---|---|---|---|---|---|---|---|---|---|---|---|---|
| 20 | 3.14E−16 | 2.60E−09 | 1.381E−23 | 300 | 1 | 1.80E−03 | 3.60E−03 | 8.25E−01 | 8.70E−02 | 287768 | 0 | 216 |
| 20 | 3.14E−16 | 2.60E−09 | 1.381E−23 | 300 | 1.5 | 1.80E−03 | 3.60E−03 | 8.25E−01 | 8.70E−02 | 647478 | 0 | 145 |
| 20 | 3.14E−16 | 2.60E−09 | 1.381E−23 | 300 | 1 | 1.30E−03 | 2.60E−03 | 8.25E−01 | 8.70E−02 | 287768 | 0 | 140 |
| 20 | 3.14E−16 | 2.60E−09 | 1.381E−23 | 300 | 1.5 | 1.30E−03 | 2.60E−03 | 8.25E−01 | 8.70E−02 | 647478 | 0 | 70 |

In Non-patent Document 8, the saturation magnetization Ms of CoFe is 2.3 T, and the saturation magnetization Ms of CoFeB after upon film formation is 0.5 T. When CoFe with the saturation magnetization Ms being no greater than 2.3 T and CoFeB with the saturation magnetization Ms being no greater than 0.5 T are used, in order to keep the overall saturation magnetization Ms of the recording layer at 1.5 T or smaller, the film thickness ratio tCoFeB/tCoFe between CoFeB and CoFe need to be 1.5 or greater. Needless to say, CoFe does not include B and therefore, the atomic fractions of CoFe are higher than those of CoFeB. For example, the ratio of CoFe atomic fractions between $(CoFe)_{67}B_{33}$ and CoFe is 67/100=0.67, which is less than 1.

Alternatively, when Fe with the saturation magnetization Ms being no greater than 2.2 T and FeV with the saturation magnetization Ms being no greater than 1.5 T are used, in order to keep the overall saturation magnetization Ms of the recording layer at 1.5 T or smaller, the film thickness ratio tFeV/tFe between FeV and Fe need to be 1.5 or greater. Needless to say, Fe does not include V and therefore, the atomic fraction of Fe is higher than that of FeV. For example, the ratio of Fe atomic fraction between $Fe_{80}V_{20}$ and Fe is 80/100=0.8, which is less than 1.

Thus, in the structure shown in FIG. 1A having an interface between one non-magnetic layer and one magnetic layer, by forming the first magnetic layer (25), which increases the interfacial magnetic anisotropy energy density $K_i$, on the first non-magnetic layer (13), and forming the second magnetic layer (12), which has low saturation magnetization Ms, on the first magnetic layer (25), it is possible to provide a magnetoresistance effect element that can achieve high thermal stability while suppressing the writing current $I_{C0}$ with a very small element size.

Also, when there are two interfaces, as shown in FIG. 1B, by inserting the first magnetic layer (25) and the third magnetic layer (17) that can increase the interfacial magnetic anisotropy energy density $K_i$ between the second magnetic layer (12) with low saturation magnetization Ms and the first non-magnetic layer (13) and between the second magnetic layer (12) and with low saturation magnetization Ms and the second non-magnetic layer (18), respectively, it is possible to provide a magnetoresistance effect element that can achieve a high thermal stability while suppressing the writing current $I_{C0}$ with a very small element size.

the first non-magnetic layer (13), and the second magnetic layer (12) has a lower saturation magnetization than that of the first magnetic layer (25).

Specifically, as shown in FIG. 1A, the first magnetic layer (25) is formed between the first non-magnetic layer (13) and the second magnetic layer (12).

More specifically, the magnetoresistance effect element includes a first magnetic layer having a magnetization direction perpendicular to a surface of the first magnetic layer (hereinafter, a direction parallel to the surface of layers is also referred to as "an in-plane direction"), a first non-magnetic layer adjacent to the first magnetic layer, and a second magnetic layer disposed adjacent to the first magnetic layer on a side opposite to the first non-magnetic layer. In other words, the first magnetic layer has a first (main) surface (upper surface) and a second (main) surface (lower surface), and the second magnetic layer is disposed on the first surface and the first non-magnetic layer is disposed on the second surface. The magnetization direction of each of the first and second magnetic layers is perpendicular to the first and second surface of the first magnetic layers, and is parallel to a direction in which the first non-magnetic layer, the first magnetic layer and the second magnetic layer are stacked. The first magnetic layer contains at least one 3d ferromagnetic transition metal element such as Co, Fe, Ni, or Mn. The second magnetic layer contains at least one 3d ferromagnetic transition metal element such as Co, Fe, Ni, or Mn, and having a saturation magnetization (Ms) lower than a saturation magnetization (Ms) of the first magnetic layer. As explained above, the second magnetic layer has a magnetization direction parallel to the magnetization direction of the first magnetic layer. Further, an interfacial perpendicular magnetic anisotropy exists at an interface between the first magnetic layer and the first non-magnetic layer, and the interfacial perpendicular magnetic anisotropy causes the first magnetic layer to have the magnetization direction perpendicular to the in-plane direction. An interfacial magnetic anisotropy energy density ($K_i$) at the interface between the first magnetic layer and the first non-magnetic layer is greater than an interfacial magnetic anisotropy energy density ($K_i$) at an interface between a first layer, a material of which is the same as a material of the first non-magnetic layer, and a second layer, a material of which is the same as a material of the second magnetic layer. In other words, the interfacial magnetic anisotropy energy density ($K_i$) at the interface between the first magnetic layer and the first non-magnetic layer is greater than an interfacial magnetic anisotropy energy density ($K_i$) at an interface between the non-first magnetic layer and the second magnetic layer if the first non-magnetic layer and the second magnetic layer are disposed adjacent each other.

In the magnetoresistance effect element, a ratio of a thickness of the second magnetic layer (12) to a thickness of the first magnetic layer (25) is at least one.

In the magnetoresistance effect element, a ratio of the sum of an atomic fraction of each magnetic element of the second magnetic layer (12) to the sum of an atomic fraction of each magnetic element of the first magnetic layer (25) is smaller than one.

To explain in further detail, the sum of the atomic fraction (at %) of each magnetic element is the total of the atomic fraction of the magnetic element contained in the metal composition relative to the entire metal composition. In the example above, the ratio of the magnetic element contained in the second magnetic layer (12) is smaller than that of the magnetic element contained in the first magnetic layer (25).

In the magnetoresistance effect element, the magnetic element contains at least one of Co, Fe, and Ni.

In the magnetoresistance effect element, the first magnetic layer (25) does not include a non-magnetic element such as V, Ti, Cr, Zr, Nb, Mo, Hf, Ta, W, Si, Al, B, Pd, or Pt and the second magnetic layer (12) includes a non-magnetic element such as V, Ti, Cr, Zr, Nb, Mo, Hf, Ta, W, Si, Al, B, Pd, and Pt, or both the first and second magnetic layers (25, 12) include a non-magnetic element such as V, Ti, Cr, Zr, Nb, Mo, Hf, Ta, W, Si, Al, B, Pd, and Pt, and the ratio of the non-magnetic element composition, such as V, Ti, Cr, Zr, Nb, Mo, Hf, Ta, W, Si, Al, B, Pd, and Pt, in the first magnetic layer (25) to the non-magnetic element composition, such as V, Ti, Cr, Zr, Nb, Mo, Hf, Ta, W, Si, Al, B, Pd, and Pt, in the second magnetic layer (12) is smaller than 1.

For example, in the magnetoresistance effect element, the first magnetic layer (25) does not include boron (B) but the second magnetic layer (12) includes boron (B), or the ratio of the boron (B) composition of the first magnetic layer (25) to the boron (B) composition of the second magnetic layer (12) is smaller than 1.

Alternatively, in the magnetoresistance effect element, the first magnetic layer (25) does not include vanadium (V) but the second magnetic layer (12) includes vanadium (V), or the ratio of the vanadium (V) composition of the first magnetic layer (25) to the vanadium (V) composition of the second magnetic layer (12) is smaller than 1.

It is preferable that the first magnetic layer(25) and the second magnetic layer (12) be made of a material that contains at least one 3d ferromagnetic transition metal such as Co, Fe, Ni, and Mn.

The magnetoresistance effect element including two non-magnetic layers as shown in FIG. 1B has the following features.

In a magnetoresistance effect element having a recording layer (19) between the first non-magnetic layer (13) and the second non-magnetic layer (18), the recording layer (19) has a multilayer structure made of the first magnetic layer (25), the third magnetic layer (17), and the second magnetic layer (12), the first magnetic layer (25) having the function of increasing interfacial magnetic anisotropy energy density ($K_i$) with the first non-magnetic layer (13) and the second non-magnetic layer (18), the second magnetic layer (12) having lower saturation magnetization (Ms) than those of the first magnetic layer (25) and the third magnetic layer (17).

Specifically, as shown in FIG. 1B, the second magnetic layer (12) is formed between the first magnetic layer (25) and the third magnetic layer (17).

In the magnetoresistance effect element, a ratio of the thickness of the second magnetic layer (12) to the thickness of the first magnetic layer (25) is at least one, and a ratio of the thickness of the second magnetic layer (12) to the thickness of the third magnetic layer (17) is at least one.

In the magnetoresistance effect element, the ratio of the sum of the atomic fractions of the magnetic elements in the second magnetic layer (12) to the sum of the atomic fractions of the magnetic elements in the first magnetic layer (25) is smaller than 1, and the ratio of the sum of the atomic fractions of the magnetic elements in the second magnetic layer (12) to the sum of the atomic fractions of the magnetic elements in the third magnetic layer (17) is smaller than 1

In the magnetoresistance effect element, the magnetic element contains at least one of Co, Fe, and Ni.

In the magnetoresistance effect element, the first magnetic layer (25) and the third magnetic layer (17) do not include a non-magnetic element such as V, Ti, Cr, Zr, Nb, Mo, Hf, Ta, W, Si, Al, B, Pd, or Pt and the second magnetic layer (12) includes a non-magnetic element such as V, Ti, Cr, Zr, Nb, Mo, Hf, Ta, W, Si, Al, B, Pd, and Pt, or the first, second, and third magnetic layers (25, 12, 17) include a non-magnetic element such as V, Ti, Cr, Zr, Nb, Mo, Hf, Ta, W, Si, Al, B, Pd, and Pt, and the ratio of the non-magnetic element composition, such as V, Ti, Cr, Zr, Nb, Mo, Hf, Ta, W, Si, Al, B, Pd, and Pt, in the first magnetic layer (25) to the non-magnetic element composition, such as V, Ti, Cr, Zr, Nb, Mo, Hf, Ta, W, Si, Al, B, Pd, and Pt, in the second magnetic layer (12) is smaller than 1, and the ratio of the non-magnetic element composition, such as V, Ti, Cr, Zr, Nb, Mo, Hf, Ta, W, Si, Al, B, Pd, and Pt, in the third magnetic layer (17) to the non-magnetic element composition, such as V, Ti, Cr, Zr, Nb, Mo, Hf, Ta, W, Si, Al, B, Pd, and Pt, in the second magnetic layer (12) is smaller than 1.

For example, in the magnetoresistance effect element, the third magnetic layer (25) and the first magnetic layer (17) do not contain B and the second magnetic layer (12) contains B, or the ratio of the composition of boron B in the first magnetic layer (25) to the composition of boron B in the second magnetic layer (12) is smaller than 1, and the ratio of the composition of boron B in the third magnetic layer (17) to the composition of boron B in the second magnetic layer (12) is smaller than 1.

In another example, in the magnetoresistance effect element, the third magnetic layer (25) and the first magnetic layer (17) do not contain vanadium (V) and the second magnetic layer (12) contains vanadium (V), or the ratio of the composition of vanadium (V) in the first magnetic layer (25) to the composition of vanadium (V) in the second magnetic layer (12) is smaller than 1, and the ratio of the composition of vanadium (V) in the third magnetic layer (17) to the composition of vanadium (V) in the second magnetic layer (12) is smaller than 1.

The first non-magnetic layer (13) and the second non-magnetic layer (18) are preferably made of a material that exhibits a large magnetoresistance change rate in combination with the material of the first magnetic layer (25) and the third magnetic layer (17) such as a material containing a compound that includes oxygen, examples of which include $MgO$, $Al_2O_3$, $SiO_2$, $TiO$, and $Hf_2O$. One of the first nonmagnetic layer (13) and the second non-magnetic layer (18) may be made of a material that contains one of Ta, W, Hf, Zr, Nb, Mo, Ti, V, and Cr.

It is preferable that the first magnetic layer (25), the second magnetic layer (12), and the third magnetic layer (17) be made of a material that contains at least one 3d ferromagnetic transition metal such as Co, Fe, Ni, and Mn.

The interface of a compound containing oxygen such as MgO, $Al_2O_3$, $SiO_2$, TiO, and $Hf_2O$ constituting the first non-magnetic layer (13) and the second non-magnetic layer (18) is in the (001) orientation, and is more susceptible to the lattice matching at the interface with the material of the first magnetic layer (25) and the third magnetic layer (17) in which the composition ratio of the non-magnetic element, such as Cr, Zr, Nb, Mo, Hf, Ta, W, Si, Al, B, Pd, and Pt, is lower. This makes it possible to increase the interfacial magnetic anisotropy energy density $K_i$.

A magnetic memory according to the present invention includes: a plurality of source lines arranged in parallel with each other; a plurality of word lines arranged in parallel with each other in a direction that intersects with the source lines; a plurality of bit lines arranged in parallel with the source lines; a select transistor having the gate electrode electrically connected to one of the word lines and the source electrode electrically connected to one of the source lines; and the magnetoresistance effect element according to the present invention, the magnetoresistance effect element being configured such that one of the first magnetic layer or the second magnetic layer is electrically connected to the drain electrode of the select transistor and the other is electrically connected to one of the bit lines, and the magnetic memory is configured such that an electric current can be applied to the magnetoresistance effect element along the thickness direction.

Because the magnetic memory according to the present invention is equipped with the magnetoresistance effect element according to the present invention, it is possible to obtain the thermal stability index of 70 or greater.

According to the present invention, it is possible to provide a magnetoresistance effect element and a magnetic memory with a low damping constant $\alpha$ and high thermal stability even with a very small junction size.

DETAILED DESCRIPTION OF THE INVENTION

Below, embodiments of the present invention will be explained with reference to the figures.

Embodiment 1

Figure 1A:
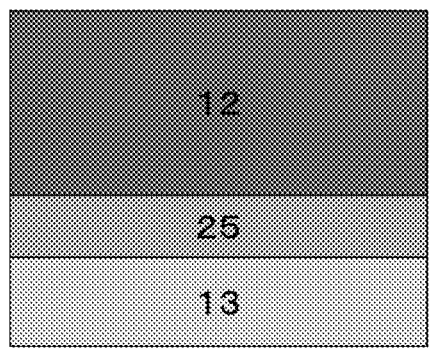
FIGS. 1A and 1B are perpendicular cross-sectional views showing a recording layer of a magnetoresistance effect element of an embodiment of the present invention.
Figure 1B:
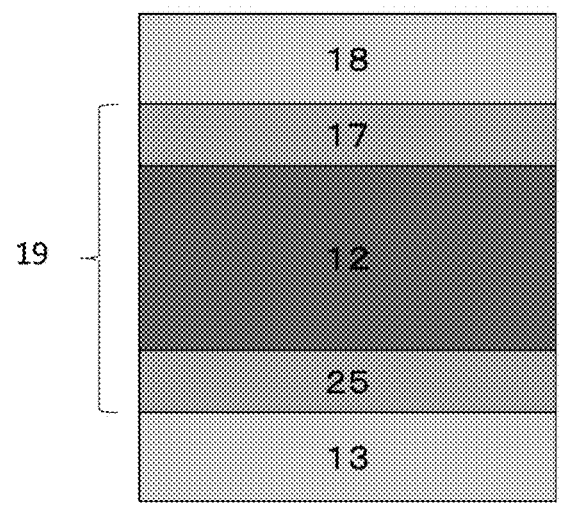
Figure 2A:
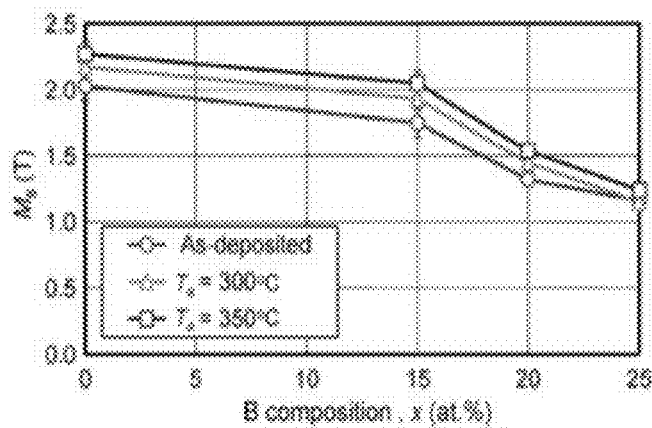
FIG. 2A is a graph showing the Ms-B ratio characteristics of the magnetoresistance effect element.
Figure 2B:
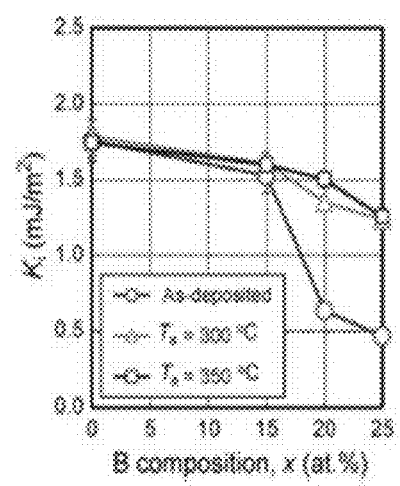
FIG. 2B is a graph showing the $K_i$-B ratio characteristics of the magnetoresistance effect element.
Figure 3:
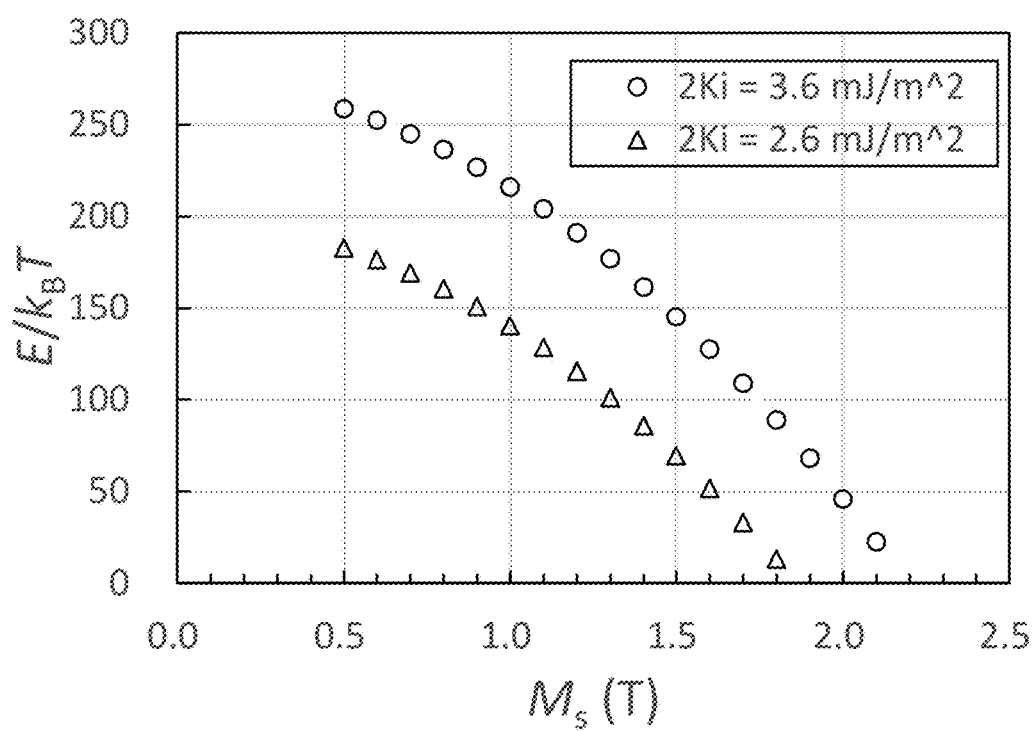
FIG. 3 is a graph showing a relationship between the thermal stability index $E/k_BT$ and the saturation magnetization Ms.
Figure 4:
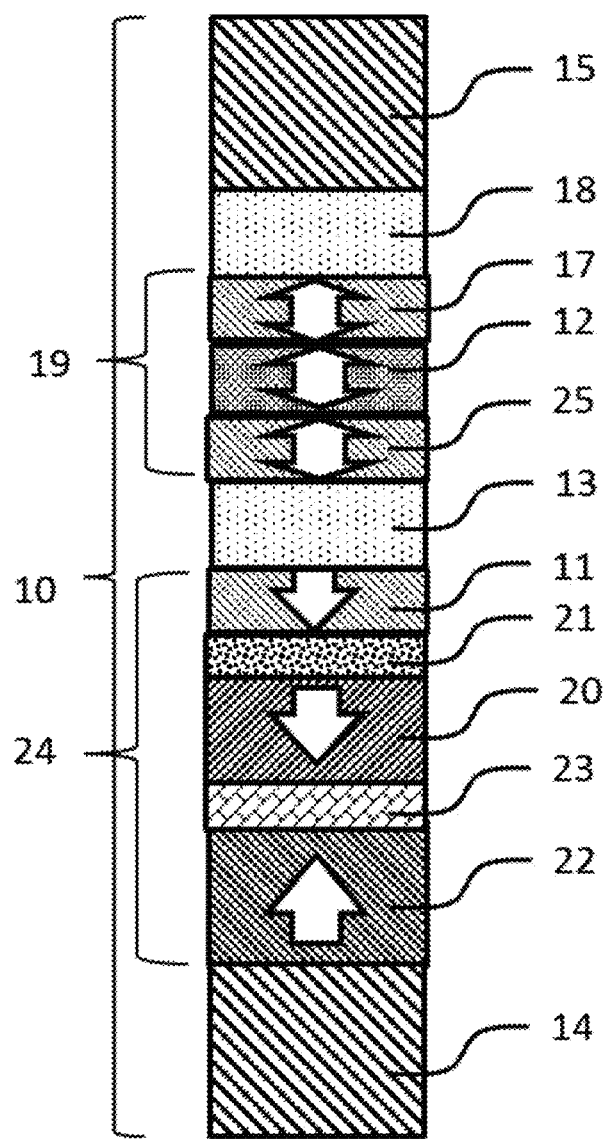
FIG. 4 is a perpendicular cross-sectional view showing Embodiments 1 and 2 of the magnetoresistance effect element of the present invention.

FIG. 4 shows a magnetoresistance effect element having a structure including two non-magnetic layers as an embodiment of the present invention.

As shown in FIG. 4, the magnetoresistance effect element (10) has a multilayer structure made of a lower non-magnetic electrode (14), a first reference layer (24), a first non-magnetic layer (13), a first recording layer (19), a second non-magnetic layer (18), and an upper non-magnetic electrode (15). The first non-magnetic layer (13) is a barrier layer (tunnel junction layer) of the magnetoresistance effect element, and the second non-magnetic layer (18) is a protective layer.

The first reference layer (24) has a multilayer structure made of an eighth magnetic layer (22), a fifth non-magnetic layer (23), a seventh magnetic layer (20), a fourth non-magnetic layer (21), and a sixth magnetic layer (11). The first recording layer (19) has a multilayer structure made of a first magnetic layer (25), a second magnetic layer (12), and a third magnetic layer (17).

(Lower Non-Magnetic Electrode 14)

The lower non-magnetic electrode (14) is connected to an end surface of the eighth magnetic layer (22), which is opposite to the end surface in contact with the fifth non-magnetic layer (23). Specifically, the lower non-magnetic electrode (14) has a multilayer structure of Sub/Ta(5 nm)/Ru(5 nm)/Ta(10 nm)/Pt(5 nm).

(Seventh Magnetic Layer 20, Eighth Magnetic Layer 22).

The seventh magnetic layer (20) and the eighth magnetic layer (22) are made of a material that contains at least one 3d ferromagnetic transition metal such as Co, Fe, Ni, and Mn. The seventh magnetic layer (20) and the eighth magnetic layer (22) may be made of an alloy film or multilayer film having the perpendicular magnetization easy axis, or may be made of an alloy film or multilayer film given the perpendicular magnetization easy axis from the shape magnetic anisotropy by making the film thickness of each film larger than the junction size. In a specific example, the eighth magnetic layer 22 is [Co (0.5 nm)/Pt(0.3 nm)]×6.5 layers, and the seventh magnetic layer 20 is [Co (0.5 nm)/Pt(0.3 nm)]×2.5 layers.

(Fifth Non-Magnetic Layer 23)

The fifth non-magnetic layer 23 is made of a material that includes one of Ru, Rh, Jr, Cr, and Cu. If the magnetization of the seventh magnetic layer 20 and the magnetization of the eighth magnetic layer 22 are anti-parallel, the fifth non-magnetic layer 23 does not need to be made of such a material. In a specific example, the fifth non-magnetic layer 23 is made of Ru (0.4 nm).

(Fourth Non-Magnetic Layer 21)

The fourth non-magnetic layer 21 is magnetically coupled with the adjacent seventh magnetic layer (20) and sixth magnetic layer (11), and is made of a material including at least one of Ta, W, Hf, Zr, Nb, Mo, Ti, V, and Cr. However, the fourth non-magnetic layer 21 does not need to be made of such a material if the fourth non-magnetic layer 21 can form magnetic coupling between the seventh magnetic layer (20) and the sixth magnetic layer (11). In a specific example, the fourth non-magnetic layer 21 is made of Ta (0.3 nm).

(Sixth Magnetic Layer 11)

The sixth magnetic layer (11) is made of a material that contains at least one 3d ferromagnetic transition metal such as Co, Fe, Ni, and Mn. In a specific example, the sixth magnetic layer (11) is made of CoFeB (1.2 nm).

(First Non-Magnetic Layer 13, Second Non-Magnetic Layer 18)

Respective end faces of the first non-magnetic layer 13 are in contact with the sixth magnetic layer (11) and the first magnetic layer (25). Respective end faces of the second non-magnetic layer (18) are in contact with the third magnetic layer (17) and the upper non-magnetic layer (15).

The first non-magnetic layer (13) and the second non-magnetic layer (18) are made of a material having a compound containing oxygen such as MgO, $Al_2O_3$, $SiO_2$, TiO, and $Hf_2O$ so that a larger magnetoresistance change rate is obtained when combined with the material of the sixth magnetic layer (11) and the first magnetic layer (25). In a specific example, the first non-magnetic layer (13) and the second non-magnetic layer (18) are made of MgO (1.2 nm). Alternatively, the first non-magnetic layer (13) may be made of MgO (1.2 nm) and the second non-magnetic layer (18) may be made of MgO (1.0 nm) with different film thicknesses.

(Third Magnetic Layer 17, First Magnetic Layer 25).

It is preferable that the third magnetic layer (17) and the first magnetic layer (25) be made of a material that contains at least one 3d ferromagnetic transition metal such as Co, Fe, Ni, and Mn. The third magnetic layer (17) and the first magnetic layer (25) do not contain B and the second magnetic layer (12) contains B, or the ratio of the composition of boron B in the third magnetic layer (17) to the composition of boron B in the second magnetic layer (12) is smaller than 1, and the ratio of the composition of boron B in the first magnetic layer (25) to the composition of boron B in the second magnetic layer (12) is smaller than 1.

In a specific example, the third magnetic layer (17) and the first magnetic layer (25) are each made of CoFe (0.4 nm to 1 nm).

(Second Magnetic Layer 12)

The second magnetic layer (12) is made of a material that contains at least one 3d ferromagnetic transition metal such as Co, Fe, Ni, and Mn. In order to increase $K_{eff}t$, the material with low saturation magnetization Ms is to be used except for the interface portion. In a specific example, the second magnetic layer (12) is made of CoFeB (0.4 nm to 5 nm). It is also possible to make CoFeB thicker than 5 nm.

(Upper Non-Magnetic Electrode 15)

The upper non-magnetic electrode (15) is connected to an end face of the second non-magnetic layer (18), which is opposite to the end face in contact with the first recording layer (19). In a specific example, the upper non-magnetic electrode (15) is made of Ta (5 nm). Alternatively, the upper non-magnetic electrode (15) may be made of Ta (5 nm)/Ru (5 nm), Ru (1 to 5 nm), Pt (1 to 5 nm), CoFeB (0.2 to 1.5 nm)/Ta (5 nm) or the like.

Next, the characteristics of the magnetoresistance effect element of Embodiment 1 of the present invention will be explained.

Figure 5:
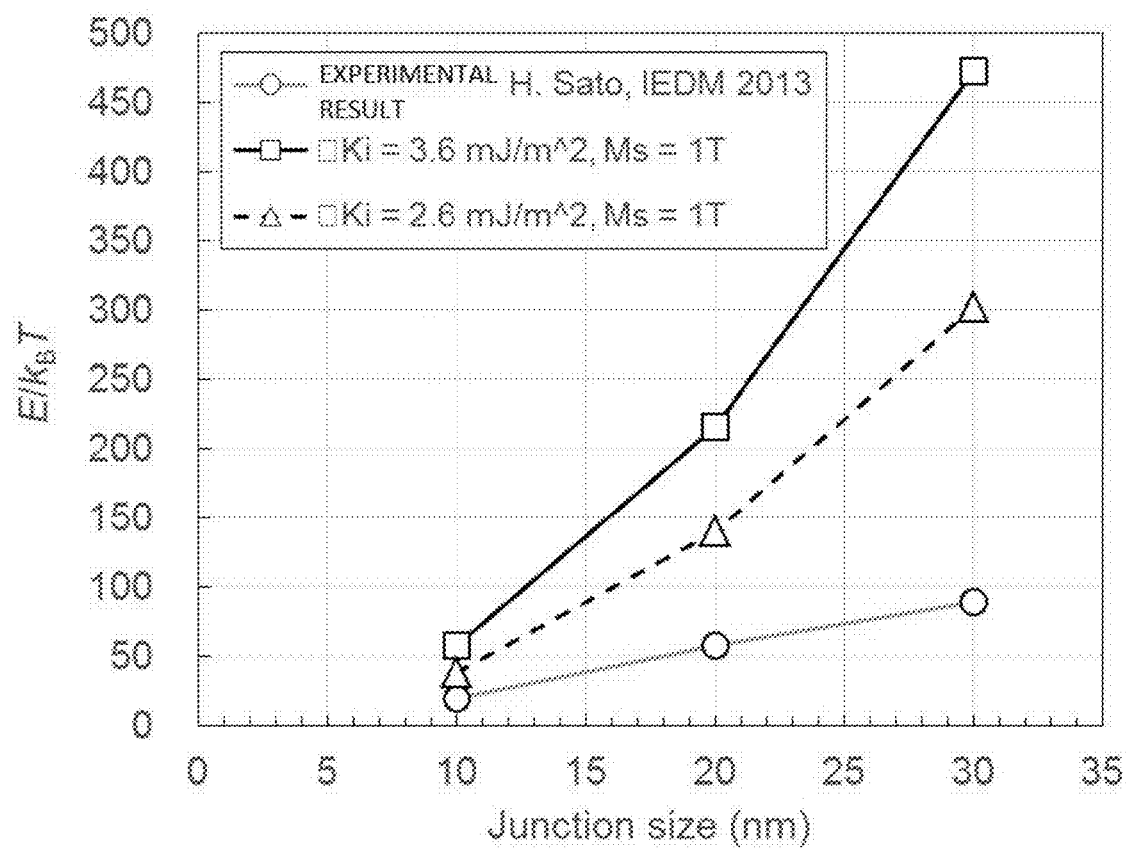
FIG. 5 is the first graph by simulation showing the relationship between the thermal stability and the interfacial magnetic anisotropy energy density $K_i$ characteristics of the magnetoresistance effect element of an embodiment of the present invention.

FIG. 5 shows the thermal stability index $E/k_B T$ calculated with Formula 1 and Formula 2 based on the junction size of MgO/CoFe/CoFeB/CoFe/MgO (total film thickness of the recording layer CoFe/CoFeB/CoFe is 2.6 nm, and $2K_i$=3.6 mJ/m2) for the first non-magnetic layer (13)/the first magnetic layer (25)/the second magnetic layer (12)/the third magnetic layer (17)/the second non-magnetic layer (18) in the multilayer structure of FIG. 4. The respective thicknesses of CoFe and CoFeB are set to 0.4 nm and 1.8 nm so that the saturation magnetization Ms of the recording layer is 1 T. By making the thickness ratio of CoFeB/CoFe constant, the saturation magnetization Ms of the overall recording layer can be made constant. In the example described above, the thickness ratio of CoFeB to CoFe is 4.5, and the total thickness of the recording layer is 2.6 nm, but it is also possible to make the total thickness of the recording layer greater than 2.6 nm while keeping the thickness ratio of CoFeB to CoFe of 4.5. As shown in FIG. 5, the MgO/CoFe/CoFeB/CoFe/MgO, in which the recording layer is sandwiched by MgO layers, can achieve a higher $E/k_B T$ than that of Non-patent Document 7 and the calculation result using $2K_i$=2.6 mJ/m$^2$, which is expected with the double interface CoFeB/MgO. Furthermore, MgO/CoFe/CoFeB/CoFe/MgO, in which the recording layer is sandwiched between MgO layers, utilizes the interfacial magnetic anisotropy energy density $K_i$ only to raise $K_{eff}t$, and therefore, by designing the thickness and composition of the intermediate CoFeB part with low saturation magnetization Ms such that it will not cause an increase in damping constant α, the writing current $I_{C0}$, can be suppressed.

As described above, the magnetoresistance effect element having the structure of FIG. 4 can achieve high thermal stability while suppressing the writing current $I_{C0}$ with a very small element size.

Figures 6A, 6B:
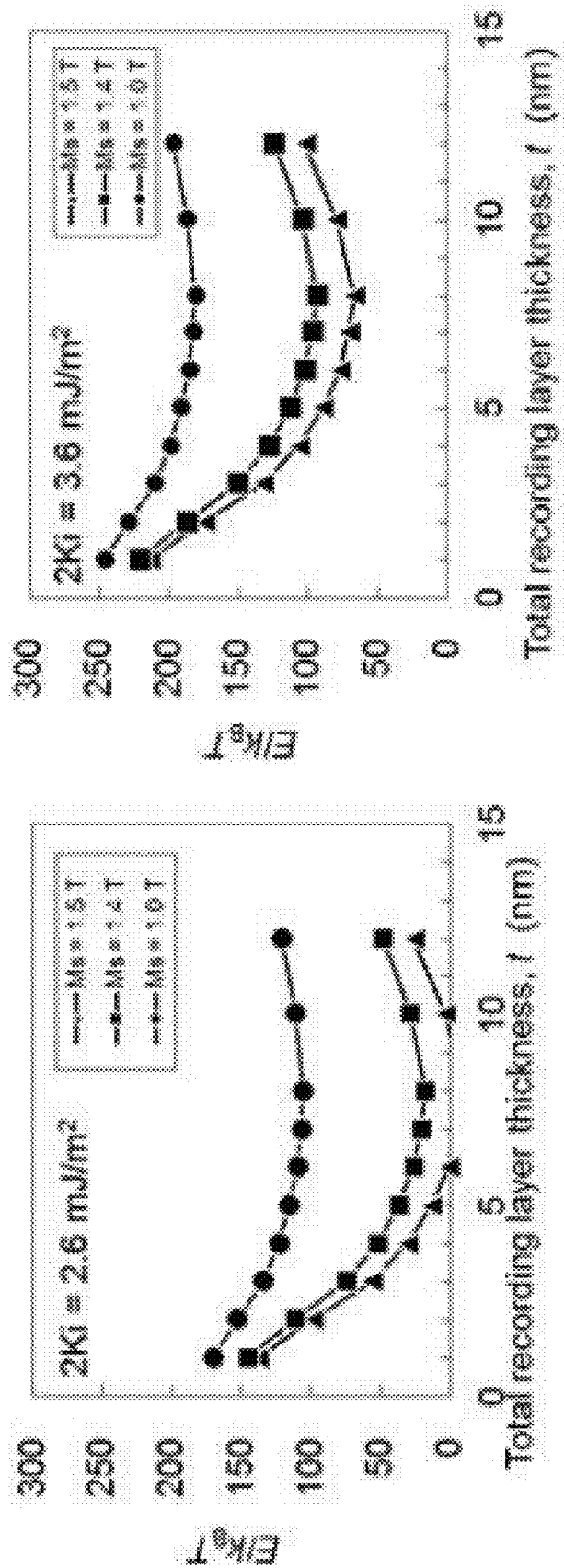
FIGS. 6A and 6B are the second graphs by simulation showing the relationship between the thermal stability and the interfacial magnetic anisotropy energy density $K_i$ characteristics of the magnetoresistance effect element of an embodiment of the present invention.

FIG. 6A and FIG. 6B respectively show the thermal stability index calculated using Formula 1 and Formula 3 for the total thickness t of the recording layer of 20 nm diameter. The demagnetizing field is corrected by ellipsoid approximation.

FIG. 6A is the thermal stability index when the saturation magnetization Ms of the recording layer is varied from 1.0 to 1.5 T at $2K_i=2.6$ mJ/m$^2$, which ideally occurs at the double CoFeB/MgO interface. FIG. 6B is the thermal stability index when the saturation magnetization Ms of the CoFe/CoFeB/CoFe recording layer is varied from 1.0 to 1.5 T at $2K_i=3.6$ mJ/m$^2$ with the double CoFeB/MgO interface. In FIGS. 6A and 6B, as the total film thickness of the recording layer increases, the thermal stability index temporarily decreases due to the decreasing effect of the interface magnetic anisotropy $K_i/t$. However, when the recording layer thickness exceeds a certain thickness, the thermal stability index starts increasing with the effect of decreasing demagnetizing field (−(Nz−Nx)Ms 2/2μ). If the saturation magnetization Ms is the same, the greater the interfacial magnetic anisotropy energy density $K_i$ is, the higher the thermal stability index is. Also the lower the saturation magnetization Ms of the overall recording layer is, or in other words, the lower the saturation magnetization of the intermediate CoFeB layer of the CoFe/CoFeB/CoFe recording layer is, the higher the thermal stability index is. Therefore, by using the structure in which the CoFe/CoFeB/CoFe recording layer is sandwiched between the MgO layers, the thermal stability index can be improved as compared with the conventional recording layer.

In FIG. 4, a magnetoresistance effect element having no first magnetic layer or third magnetic layer can likewise obtain high thermal stability while suppressing the writing current $I_{C0}$ with a very small element size.

Embodiment 2

With respect to the first non-magnetic layer (13)/the first magnetic layer (25)/the second magnetic layer (12)/the third magnetic layer (17)/the second non-magnetic layer (18) of the multilayer structure of FIG. 4, the following materials, thicknesses, and B composition were specifically employed: the thickness of CoFeB of the first magnetic layer (25) and the third magnetic layer (17) is 0.4 nm, the thickness of CoFeB of the second magnetic layer (12) is 1.8 nm, the B composition of the first magnetic layer (25) and the third magnetic layer (17) is $Co_{24}Fe_{71}B_5$ (5/100=0.05), the B composition of the second magnetic layer (12) is $Co_{16}Fe_{49}B_{35}$ (35/100=0.35), and the ratio of the B composition of the first magnetic layer (25) and the third magnetic layer (17) to the B composition of the second magnetic layer (12) is 0.05/0.35=0.14. The ratio of the thickness of CoFeB of the second magnetic layer (12) to the thickness of CoFeB of the first magnetic layer (25) and the third magnetic layer (17) is 4.5, and the total thickness of the recording layer is 2.6 nm. Furthermore, MgO/CoFeB/CoFeB/CoFeB/MgO, in which the recording layer is sandwiched between MgO layers, utilizes the interfacial magnetic anisotropy energy density$K_i$ only to raise $K_{eff}t$, and therefore, by designing the thickness and composition of the intermediate CoFeB part of the first, second, and third magnetic layers, which has low saturation magnetization Ms, such that it will not cause an increase in damping constant α, the writing current $I_{C0}$ can be suppressed. Also the lower the saturation magnetization Ms of the overall recording layer is, or in other words, the lower the saturation magnetization of the intermediate CoFeB layer of the MgO/CoFeB/CoFeB/CoFeB/MgO is, the higher the thermal stability index is. Therefore, by using the structure in which the CoFeB/CoFeB/CoFeB recording layer is sandwiched between the MgO layers, the thermal stability index can be improved as compared with the conventional recording layer.

In FIG. 4, a magnetoresistance effect element having no first magnetic layer or third magnetic layer can likewise obtain high thermal stability while suppressing the write current $I_{C0}$ with a very small element size.

Embodiment 3

Figure 7:
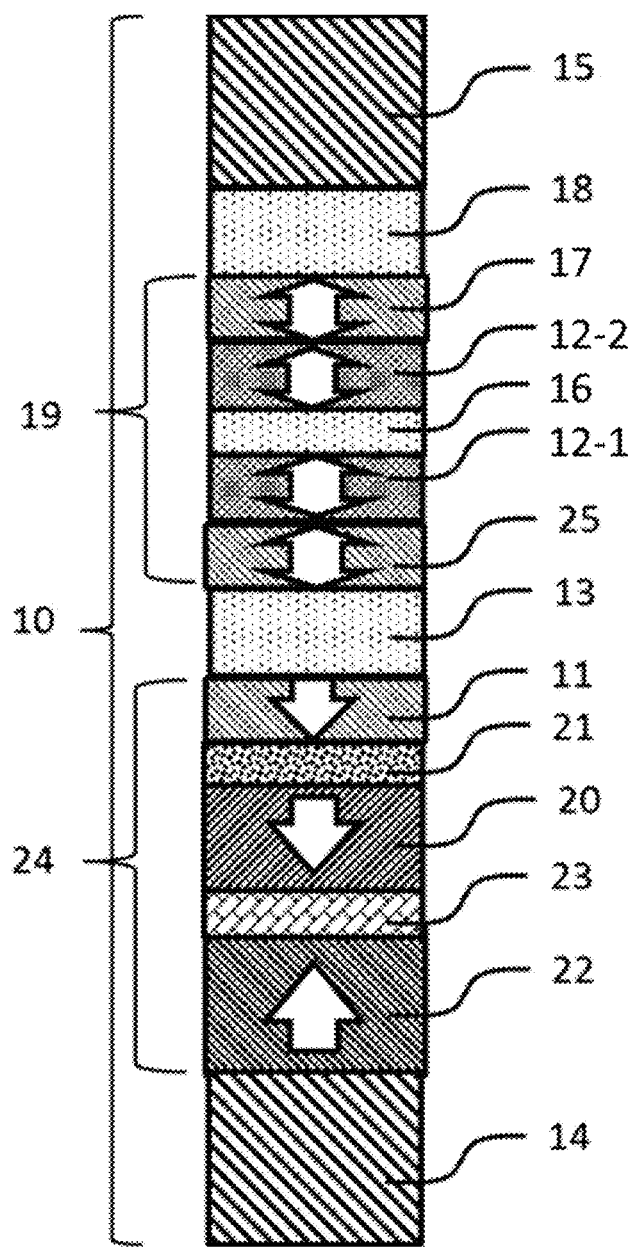
FIG. 7 is a perpendicular cross-sectional view showing Embodiment 3 of the magnetoresistance effect element of the present invention.

FIG. 7 shows Embodiment 3 of the magnetoresistance effect element of the present invention.

In Embodiment 3, the second magnetic layer (12) is made of the fourth magnetic layer (12-1) and the fifth magnetic layer (12-2), and the third non-magnetic layer (16) is interposed between the fourth magnetic layer (12-1) and the fifth magnetic layer (12-2) to control the B concentration. The third non-magnetic layer (16) is provided to control the concentration of B.

In Embodiment 3, the third non-magnetic layer (16) functions as the area to block the diffusion of B from the fourth magnetic layer (12-1) and the fifth magnetic layer (12-2), and has the function of controlling the B concentration in the fourth magnetic layer (12-1) and the fifth magnetic layer (12-2). If the third non-magnetic layer (16) is Ta, for example, it is preferable that the thickness thereof be 1nm or smaller. As a result, the B concentration of the first magnetic layer (25) and the third magnetic layer (17) is lowered, which allows the interfacial magnetic anisotropy energy density$K_i$ to be high at the interface with the first non-magnetic layer (13) and the second non-magnetic layer (18), and allows areas other than the interface regions to have lower Ms.

With respect to the first non-magnetic layer (13)/the first magnetic layer (25)/the fourth magnetic layer (12-1)/the third non-magnetic layer (16)/the fifth magnetic layer (12-2)/the third magnetic layer (17)/the second non-magnetic layer (18) of the multilayer structure of FIG. 7, the following materials, thicknesses, and B composition were specifically employed: the thickness of CoFeB of the first magnetic layer (25) and the third magnetic layer (17) is 0.4 nm, the thickness of CoFeB of the fourth magnetic layer (12-1) and the fifth magnetic layer (12-2) is 0.9 nm, the thickness of the third non-magnetic layer (16) is 0.5 nm, the B composition of the first magnetic layer (25) and the third magnetic layer (17) is $Co_{24}Fe_{71}B_5$ (5/100=0.05), and the B composition of the fourth magnetic layer (12-1) and the fifth magnetic layer(12-2) is $Co_{16}Fe_{49}B_{35}$ (35/100=0.35). The total thickness of the recording layer is 3.1 nm. Furthermore, MgO/CoFeB/CoFeB/Ta/CoFeB/CoFeB/MgO, in which the recording layer is sandwiched between MgO layers, utilizes the interfacial magnetic anisotropy energy density $K_i$ only to raise $K_{eff}t$, and therefore, by designing the thickness and composition of the intermediate magnetic layer of the first, third, fourth, and fifth magnetic layers with low saturation magnetization Ms, such that it will not cause an increase in damping constant α, the writing current $I_{C0}$ can be suppressed. Also the lower the saturation magnetization Ms of the overall recording layer is, or in other words, the lower the saturation magnetization of the recording layer CoFeB/CoFeB/Ta/CoFeB/CoFeB of MgO/CoFeB/CoFeB/Ta/CoFeB/CoFeB/MgO is, the higher the thermal stability index is. Therefore, by using the structure in which the CoFeB/CoFeB/Ta/CoFeB/CoFeB recording layer is sandwiched between the MgO layers, the thermal stability index can be improved as compared with the conventional recording layer.

Embodiment 4

Figure 8:
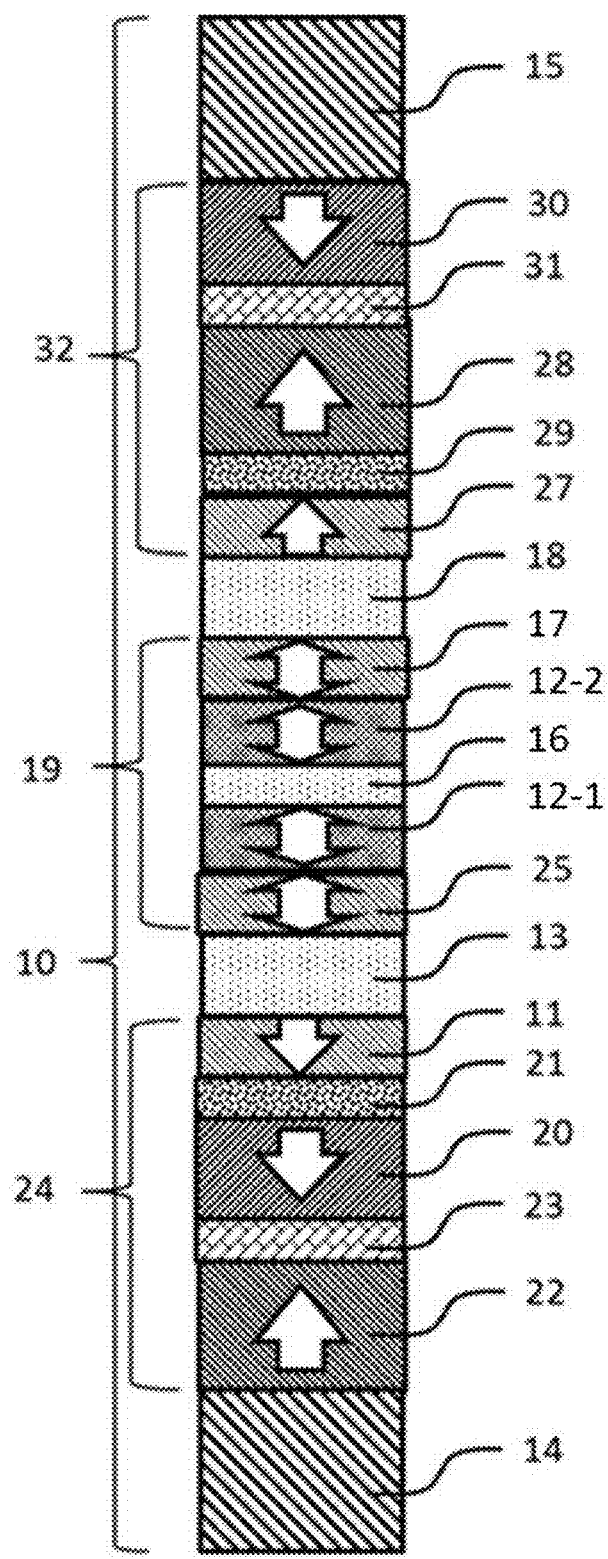
FIG. 8 is a perpendicular cross-sectional view showing Embodiment 4 of the magnetoresistance effect element of the present invention.

FIG. 8 shows Embodiment 4 of the magnetoresistance effect element of the present invention.

Embodiment 4 differs from Embodiments 1 and 2 in having the second reference layer (32).

The second reference layer (32) has the function of an anti-parallel coupling reference layer. In the second reference layer (32), the magnetization directions of the respective magnetic layers are opposite to those of the first reference layer 24.

This is effective to improve the spin injection efficiency and reduce the writing current $I_{C0}$.

Embodiment 5

Figure 9:
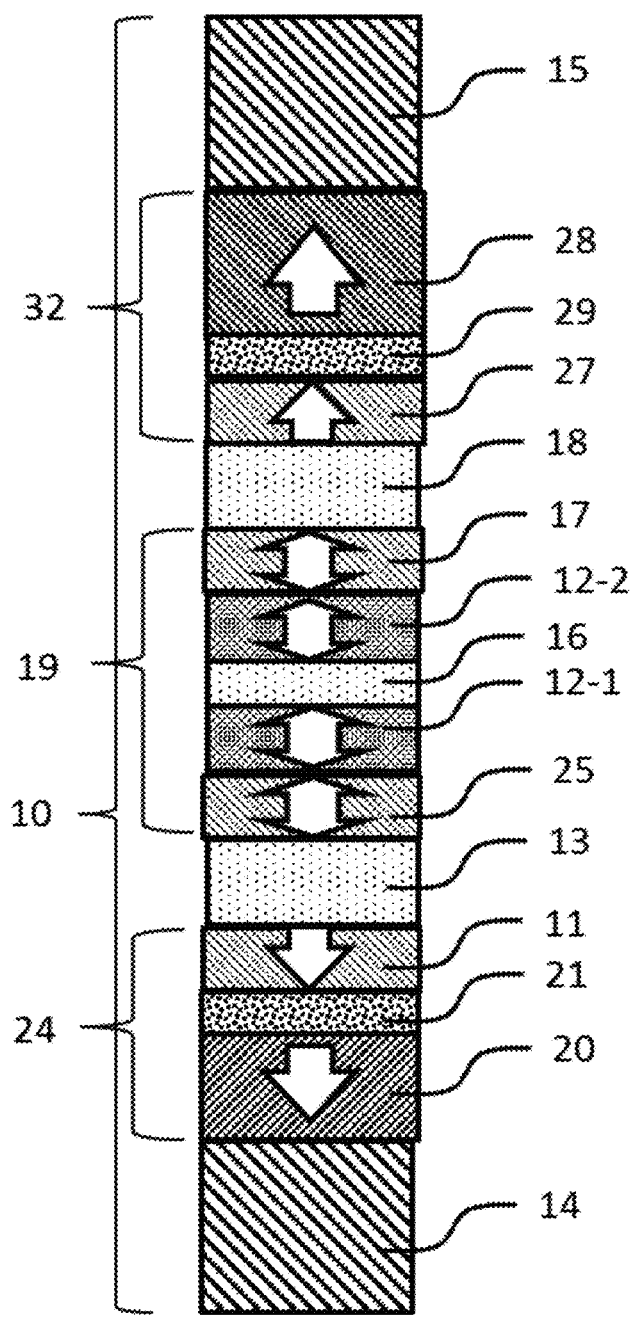
FIG. 9 is a perpendicular cross-sectional view showing Embodiment 5 of the magnetoresistance effect element of the present invention.

FIG. 9 shows Embodiment 5 of the magnetoresistance effect element of the present invention. Embodiment 5 also has the second reference layer (32) like Embodiment 4, but differs from Embodiment 4 in that the second reference layer is not an antiparallel coupling layer.

Embodiment 6

Figure 10:
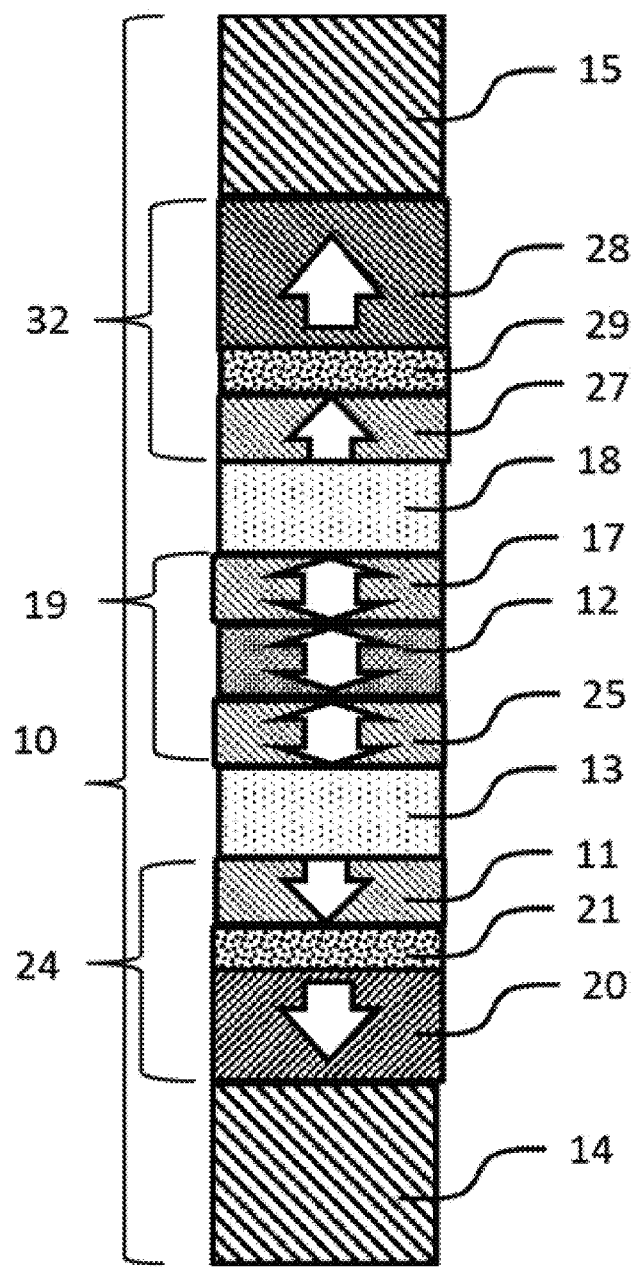
FIG. 10 is a perpendicular cross-sectional view showing Embodiment 6 of the magnetoresistance effect element of the present invention.

FIG. 10 shows Embodiment 6 of the magnetoresistance effect element of the present invention. Embodiment 6 has the multilayer structure in which the second magnetic layer (12) and the third magnetic layer (17) are in direct contact as in Embodiments 1 and 2 of the present invention, and also includes the second reference layer (32) as in Embodiment 5. Depending on whether it is necessary to control the concentration of B or not, the third non-magnetic layer (16) may be omitted.

Embodiment 7

Figure 11:
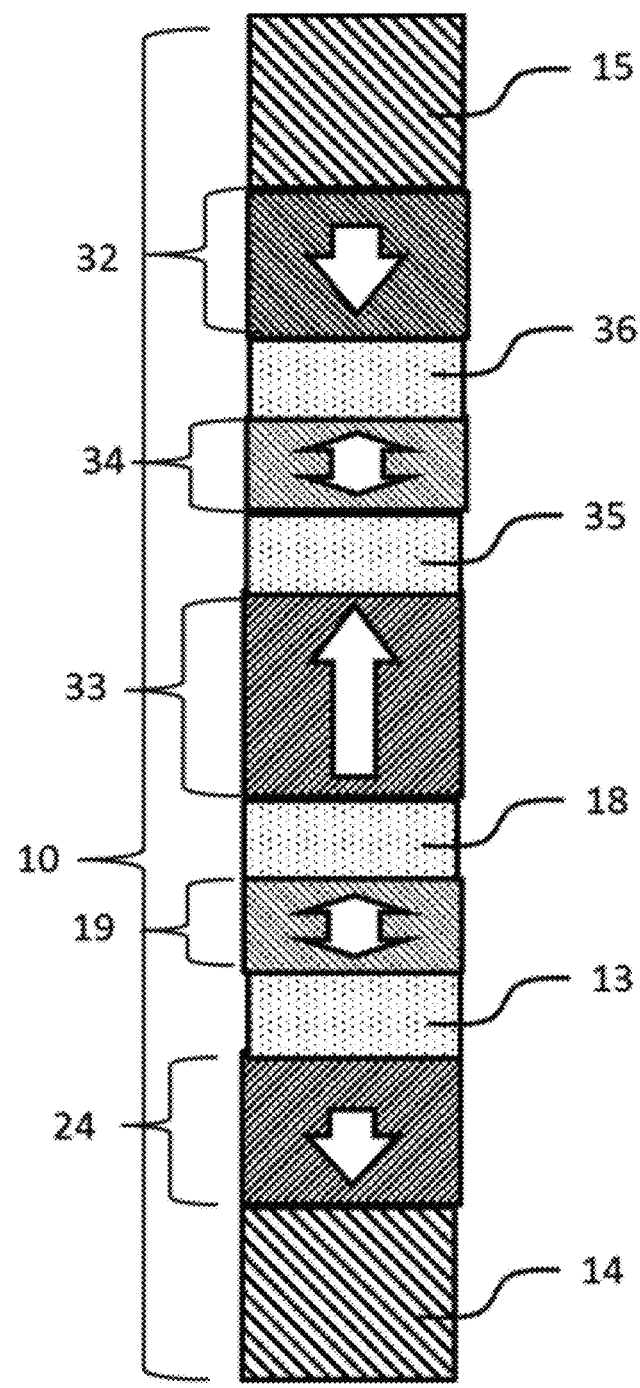
FIG. 11 is a perpendicular cross-sectional view showing Embodiment 7 of the magnetoresistance effect element of the present invention.

FIG. 11 shows Embodiment 7 of the magnetoresistance effect element of the present invention. Embodiment 7 has a multilayer structure including two recording layers of the first recording layer (19) and a second recording layer (34), and three reference layers of the first reference layer (24), the second reference layer (32), and the third reference layer (33).

With Embodiment 7, it is possible to provide the multi-value function using those three reference layers.

Modification Example of Embodiment 1

Next, the characteristics of the magnetoresistance effect element of a modification example of Embodiment 1 of the present invention will be explained.

The characteristics required for the junction interface between the magnetic layer and the nonmagnetic layer of the perpendicular magnetic anisotropic magnetoresistance effect element applied to the magnetic memory of the present invention are the high tunnel magnetoresistance (TMR) ratio, the low writing current $I_{C0}$, and high thermal stability. The writing current $I_{C0}$ is determined by the damping constant α, and it is preferable that the damping constant α be 0.01 or smaller, or it is more preferable that the damping constant α be 0.005 or smaller. Further, for example, at the junction surface of the magnetoresistance effect element having the junction size diameter of 20 nm, the interfacial magnetic anisotropy energy density $K_i$ is required to be 2.6 mJ/m$^2$ or more.

In FIG. 4, the first non-magnetic layer (13) and the second non-magnetic layer (18) are made of MgO (1.2 nm), and the third magnetic layer (17) and the first magnetic layer (25) are made of Fe (0.4 nm to 1 nm). The second magnetic layer (12) is made of FeV (0.01 nm to 0.4 nm).

Figure 13A:
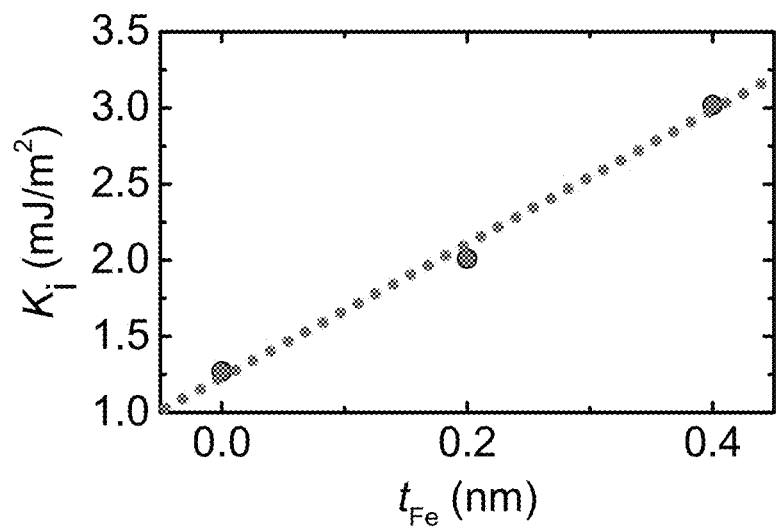
FIG. 13A is a graph showing the relationship between the Fe layer thickness and the interfacial magnetic anisotropy energy density $K_i$ characteristics.

FIG. 13A shows the interfacial magnetic anisotropy energy density $K_i$ characteristics for the Fe layer thickness when MgO/Fe/FeV/Fe/MgO (junction size diameter of the recording layer Fe/FeV/Fe is 20 nm) were used as the specific materials of the first non-magnetic layer (13)/the first magnetic layer (25)/the second magnetic layer (12)/the third magnetic layer (17)/the second non-magnetic layer(18) in the multilayer structure of FIG. 4. As shown in FIG. 13A, as the Fe layer thickness increases, the interfacial magnetic anisotropy energy density $K_i$ linearly increases.

Figure 13B:
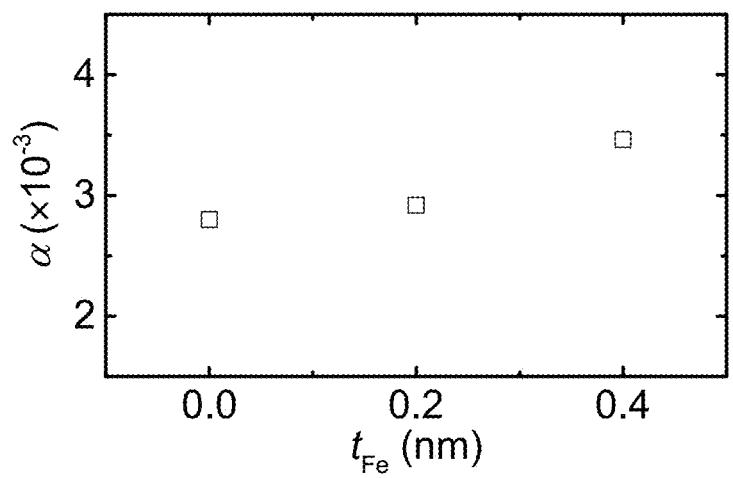
FIG. 13B is a graph showing the relationship between the Fe layer thickness and the damping constant $\alpha$ characteristics of the magnetoresistance effect element of Embodiment 2 of the present invention.
Figure 14:
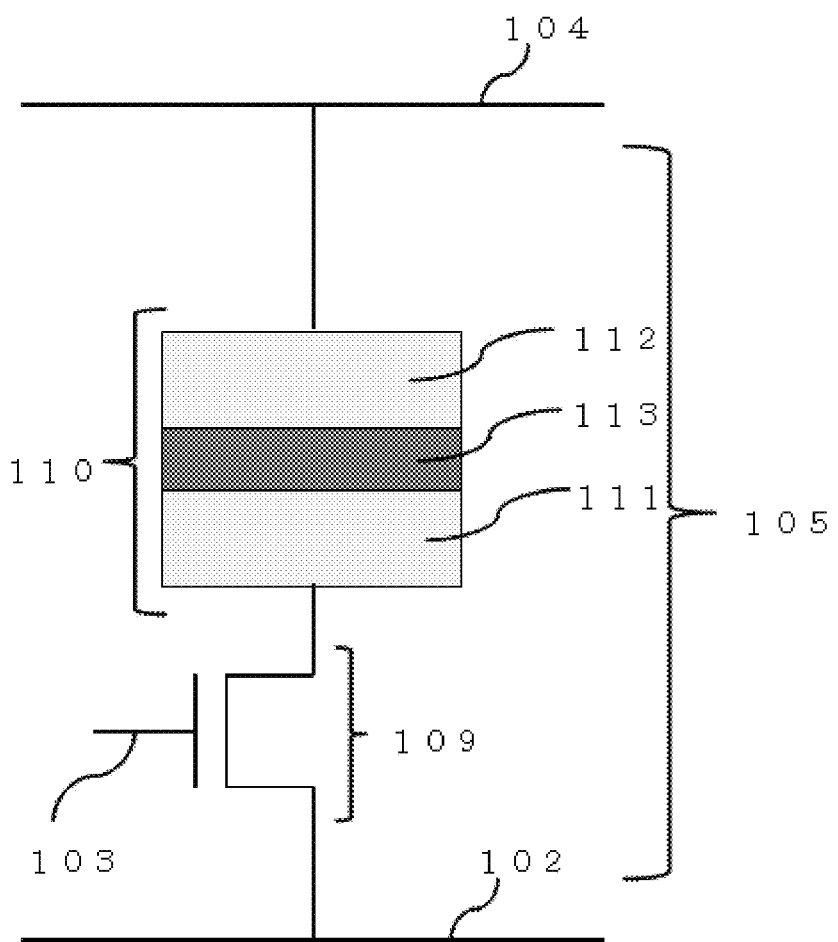
FIG. 14 is a circuit diagram showing a magnetic memory cell of a magnetic memory having a conventional magnetoresistance effect element.
Figure 15C:
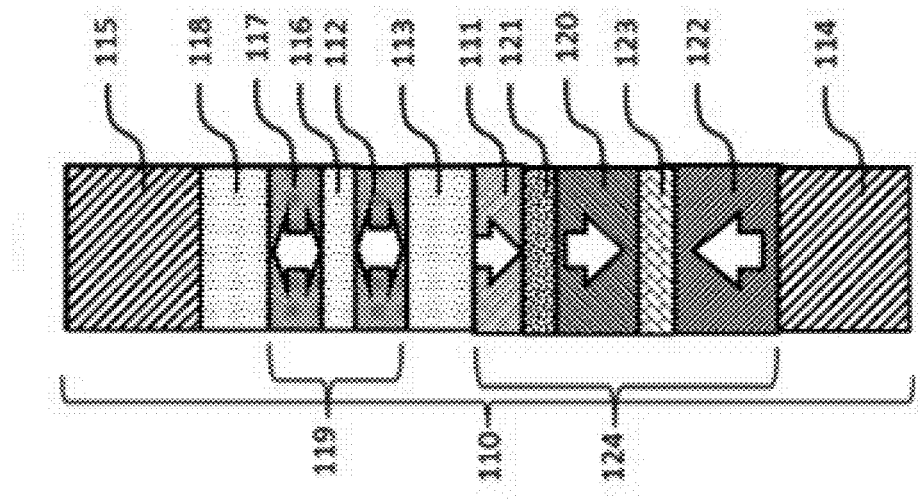
FIG. 15C is a perpendicular cross-sectional view of yet another conventional perpendicular magnetic anisotropy magnetoresistance effect element.
Figure 15B:
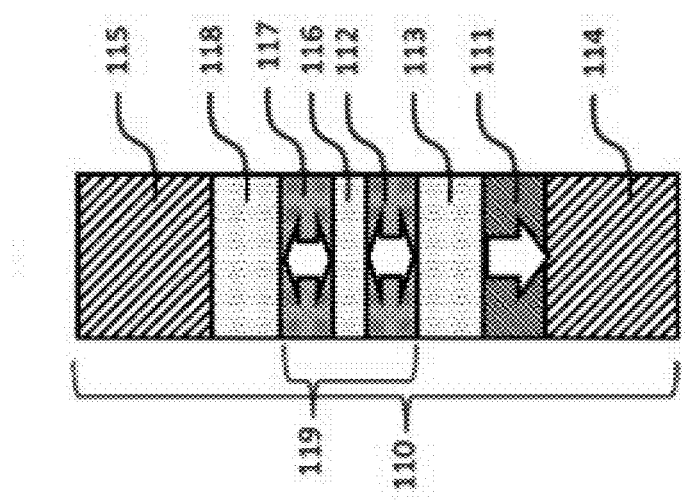
FIG. 15B is a perpendicular cross-sectional view of another conventional perpendicular magnetic anisotropy magnetoresistance effect element.
Figure 15A:
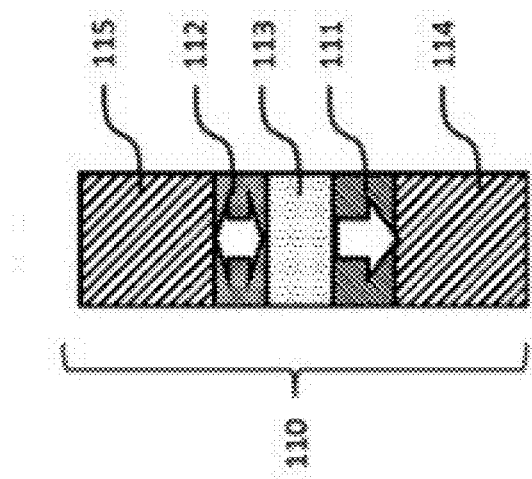
FIG. 15A is a perpendicular cross-sectional view of a conventional perpendicular magnetic anisotropy magnetoresistance effect element.

FIG. 13B shows the damping constant α characteristics for the Fe thickness. As shown in FIG. 13B, as the Fe layer thickness increases, the damping constant α slightly increases, but the value thereof stays under 0.005.which is the required value of the damping constant α at the junction interface of the junction size diameter 20 nm.

As described above, the magnetoresistance effect element of the modification example of Embodiment 1 having the structure shown in FIG. 4 can keep the value of the damping constant α under a certain level, thereby making it possible to suppress the writing current $I_{C0}$ with a very small element size.

Embodiments 2 to 7 may also be modified in a manner similar to the modification example of Embodiment 1 by applying Fe and FeV to the recording layer.

Modification Example of Embodiment 2

Next, the characteristics of the magnetoresistance effect element of a modification example of Embodiment 2 of the present invention will be explained.

In FIG. 4, MgO was used for the first non-magnetic layer (13) and the second non-magnetic layer (18), and FeV was used for the third magnetic layer (17) and the first magnetic layer (25). The second magnetic layer (12) is made of FeV having a higher V composition than FeV used for the third magnetic layer (17) and the first magnetic layer (25).

As the Fe layer thickness increases, the interfacial magnetic anisotropy energy density $K_i$ linearly increases. Also, as the Fe layer thickness increases, the damping constant α slightly increases, but the value thereof stays under 0.005.which is the required value of the damping constant α at the junction interface of the junction size diameter 20 nm.

As described above, the magnetoresistance effect element of the modification example of Embodiment 2 having the structure shown in FIG. 4 can keep the value of the damping constant α under a certain level, thereby making it possible to suppress the writing current $I_{C0}$ even with a very small element size.

Embodiments 2 to 7 may also be modified in a manner similar to the modification example of Embodiment 2 by applying FeV to the recording layer.

The respective embodiments and modification examples described above may further modified. For example, by making the ratio of the non-magnetic element composition, such as Ti, Cr, Zr, Nb, Mo, Hf, Ta, W, Si, Al, Pd, and Pt, in the first magnetic layer (25) to the non-magnetic element composition, such as Ti, Cr, Zr, Nb, Mo, Hf, Ta, W, Si, Al, Pd, and Pt, in the second magnetic layer (12) smaller than 1, and by making the ratio of the non-magnetic element composition, such as Ti, Cr, Zr, Nb, Mo, Hf, Ta, W, Si, Al, Pd, and Pt, in the third magnetic layer (17) to the non-magnetic element composition, such as Ti, Cr, Zr, Nb, Mo, Hf, Ta, W, Si, Al, Pd, and Pt, in the second magnetic layer (12) smaller than 1, the value of the damping constant α can be kept under a certain level, which makes it possible to suppress the writing current $I_{C0}$ even with a very small element size.

Furthermore, it is also possible to keep the value of the damping constant α under a certain level, which makes it possible to suppress the writing current $I_{C0}$ even with a very small element size, by forming Fe(V) on the CoFe(B) material or laminating different non-magnetic elements or different magnetic elements. Specific examples of the multilayer structure include MgO/FeB/FeV/FeB/MgO, MgO/Fe$_{95}$B$_5$/FeV/Fe$_{90}$B$_{10}$/MgO, MgO/Co$_{24}$Fe$_{71}$B$_5$/FeV/Co$_{22}$Fe$_{68}$B$_{10}$/MgO, MgO/Co$_{47}$Fe$_{48}$B$_5$/FeV/Co$_{22}$Fe$_{68}$B$_{10}$/MgO, MgO/FeB/FeV/FeTa/MgO, and MgO/(Co)FeB/FeV/(Co)FeM/MgO (M includes at least Ti, Cr, Zr, Nb, Mo, Hf, Ta, W, Si, Al, Pd, and Pt, and two or more types of elements may be mixed).

Magnetic Memory 1 in Embodiment of the Present Invention

Figure 12:
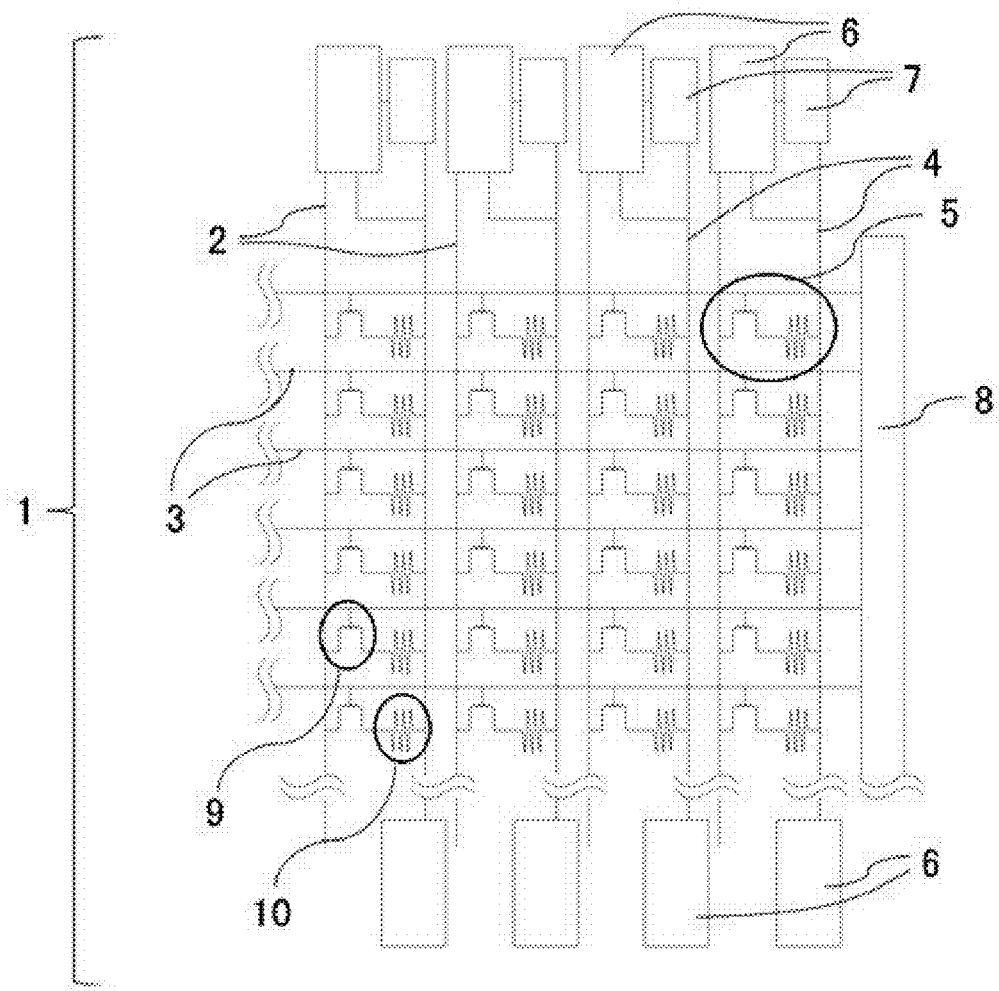
FIG. 12 is a circuit block diagram showing the magnetic memory of an embodiment of the present invention.

FIG. 12 shows a magnetic memory (MRAM) as an embodiment of the present invention. As shown in FIG. 12, the magnetic memory (1) includes a plurality of source lines (2), a plurality of word lines 3, a plurality of bit lines (4), and a plurality of memory cells (5).

The respective source lines (2) are arranged in parallel with each other. The respective word lines (3) are arranged in parallel with each other in the direction intersecting with the source lines (2). The respective bit lines (4) are arranged in parallel with each other so as to be in parallel with the respective source lines (2). The respective source lines (2) and the respective bit lines (4) are alternately arranged in parallel with each other in the lateral direction. One end of each source line (2) and each bit line (4) is electrically connected to a write driver (6) and a sense amplifier (7) for voltage application. One end of each word line (3) is electrically connected to a word driver (8).

Each memory cell (5) is disposed at each intersection of the bit lines (4) and the word lines (3). Each memory cell (5) includes a select transistor (9) and a magnetoresistance effect element (10). In the select transistor (9), the gate electrode is electrically connected to the word line (3), and the source electrode is electrically connected to the source line (2) via a wiring layer. In the magnetoresistance effect element (10), one of the sixth magnetic layer (11) and the second magnetic layer (12) is electrically connected to the drain electrode of the select transistor (9) via a lower non-magnetic electrode (14) or an upper non-magnetic electrode (15), and the other is electrically connected to the bit line (4). The magnetoresistance effect element (10) is one of those shown in FIGS. 1, 4, or 6 to 11. The magnetic memory (1) is configured so as to be able to apply a current to the magnetoresistance effect element (10) along the thickness direction.

Next, the operation will be explained.

In an operation to write "1," the write driver (6) applies a voltage on the source lines (2), and the word driver (8) applies a voltage on the word lines (3), thereby causing a current to flow from the source line (2) to the bit line (4) via the magnetoresistance effect element (10). This makes the magnetization direction of the second magnetic layer (12), which is the recording layer of the magnetoresistance effect element (10) having a free magnetization direction, antiparallel to the magnetization direction of the sixth magnetic layer (11), which is the reference layer having a fixed magnetization direction. As a result, the magnetoresistance effect element (10) enters a high resistance state, and the magnetoresistance effect element (10) holds the information "1."

On the other hand, in an operation to write "0," the write driver (6) applies a voltage on the bit line (4), and the word driver (8) applies a voltage on the word lines (3), thereby causing a current to flow from the bit line (4) to the source line (2) via the magnetoresistance effect element (10). This makes the magnetization direction of the second magnetic layer (12), which is the recording layer of the magnetoresistance effect element (10) having a free magnetization direction, parallel to the magnetization direction of the sixth magnetic layer (11), which is the reference layer having a fixed magnetization direction. As a result, the magnetoresistance effect element (10) enters a low resistance state, and the magnetoresistance effect element (10) holds the information "0."

In order to read out the information, the sense amplifier (7) reads out a difference in signals due to the change in resistance. By such a memory array, it is possible to achieve a magnetic memory having the magnetoresistance effect element 10 with a larger magnetoresistance change rate, a smaller write current, and a higher thermal stability than that of the conventional structure.

What is claimed is:

1. A magnetoresistance effect element, comprising:
    a first magnetic layer having a magnetization direction perpendicular to a surface of the first magnetic layer, the first magnetic layer containing at least one 3d ferromagnetic transition metal element;
    a first non-magnetic layer adjacent to the first magnetic layer, a perpendicular magnetic anisotropy with an interfacial magnetic anisotropy energy density ($K_i$) existing at an interface between the first magnetic layer and the first non-magnetic layer, said perpendicular magnetic anisotropy causing the first magnetic layer to have the magnetization direction perpendicular to the in-plane direction; and
    a second magnetic layer disposed adjacent to the first magnetic layer on a side opposite to the first non-magnetic layer, the second magnetic layer having a magnetization direction parallel to the magnetization direction of the first magnetic layer, the second magnetic layer containing at least one 3d ferromagnetic transition metal element, and having a saturation magnetization (Ms) lower than a saturation magnetization (Ms) of the first magnetic layer, an interfacial magnetic anisotropy energy density ($K_i$) at the interface between the first magnetic layer and the first non-magnetic layer being greater than an interfacial magnetic anisotropy energy density ($K_i$) at an interface between one layer, a material of which is the same as a material of the first non-magnetic layer, and another layer, a material of which is the same as a material of the second magnetic layer.

2. The magnetoresistance effect element according to claim 1, wherein the second magnetic layer has a thickness greater than that of the first magnetic layer.

3. The magnetoresistance effect element according to claim 1, wherein an atomic fraction of the at least one 3d ferromagnetic transition metal element of the second magnetic layer is smaller than that of the first magnetic layer.

4. The magnetoresistance effect element according to claim 1, wherein the second magnetic layer has a boron composition greater than that of the first magnetic layer.

5. The magnetoresistance effect element according to claim 1, wherein
each of the first and second magnetic layers contains a non-magnetic element, and
the second magnetic layer has a non-magnetic element composition greater than that of the first magnetic layer.

6. The magnetoresistance effect element according to claim 5, wherein the at least one non-magnetic element in each of the first and second magnetic layers includes one of V, Ti, Cr, Zr, Nb, Mo, Hf, Ta, W, Si, Al, B, Pd, or Pt.

7. The magnetoresistance effect element according to claim 1, further comprising:
a third magnetic layer disposed adjacent to the second magnetic layer on a side opposite to the first magnetic layer, the third magnetic layer having a magnetization direction parallel to the magnetization direction of the first magnetic layer, the third magnetic layer containing at least one 3d ferromagnetic transition metal element; and
a second non-magnetic layer disposed adjacent to the third magnetic layer on a side opposite to the second magnetic layer, wherein
the third magnetic layer increases an interfacial magnetic anisotropy energy density ($K_i$) at an interface with the second non-magnetic layer.

8. The magnetoresistance effect element according to claim 7, wherein the second magnetic layer is thicker than each of the first and third magnetic layers.

9. The magnetoresistance effect element according to claim 7, wherein an atomic fraction of the at least one 3d ferromagnetic transition metal element of the second magnetic layer is smaller than that of each of the first and third magnetic layers.

10. The magnetoresistance effect element according to claim 7, wherein the second magnetic layer has a boron composition greater than any boron compositions of the first and third magnetic layers.

11. The magnetoresistance effect element according to claim 7, wherein the first, second and third magnetic layers each contain at least one non-magnetic element, and
the second magnetic layer has a non-magnetic element composition greater than any non-magnetic element compositions of the first and third magnetic layers.

12. The magnetoresistance effect element according to claim 11, wherein the at least one non-magnetic element in each of the first to third magnetic layers includes one of V, Ti, Cr, Zr, Nb, Mo, Hf, Ta, W, Si, Al, B, Pd, or Pt.

13. The magnetoresistance effect element according to claim 7, wherein
the second magnetic layer has a multi-layer structure including fourth and fifth magnetic layers and a third non-magnetic layer disposed between the fourth and fifth magnetic layers, and
the fourth and fifth magnetic layers each contain at least one 3d ferromagnetic transition metal element.

14. The magnetoresistance effect element according to claim 13, wherein a combined thickness of the fourth and fifth magnetic layers is equal to or greater than a combined thickness of the first and third magnetic layers.

15. The magnetoresistance effect element according to claim 13, wherein an atomic fraction of the at least one 3d ferromagnetic transition metal element of each of the fourth and fifth magnetic layers is smaller than any atomic fraction of the at least one 3d ferromagnetic transition metal element of each of the first and third magnetic layers.

16. The magnetoresistance effect element according to claim 13, wherein the fourth and fifth magnetic layers each have a boron composition greater than any boron composition of each of the first and third magnetic layers.

17. The magnetoresistance effect element according to claim 13, wherein
the fourth and fifth magnetic layers each contain at least one non-magnetic element, and
the fourth and fifth magnetic layers each have a non-magnetic element composition greater than any non-magnetic element composition of each of the first and third magnetic layers.

18. The magnetoresistance effect element according to claim 13, wherein the third non-magnetic layer has a thickness that is no greater than 1 nm.

19. The magnetoresistance effect element according to claim 18, wherein the at least one non-magnetic element in each of the fourth and fifth magnetic layers includes one of V, Ti, Cr, Zr, Nb, Mo, Hf, Ta, W, Si, Al, B, Pd, or Pt.

20. The magnetoresistance effect element according to claim 13, wherein
the at least one 3d ferromagnetic transition metal element in each of the fourth and fifth magnetic layers includes one of Co, Fe, Ni, or Mn.

21. The magnetoresistance effect element according to claim 1, further comprising:
a second non-magnetic layer disposed on one side of the second magnetic layer opposite to another side on which the first magnetic layer is disposed; and
two reference layers, each of which is disposed on either one side of the first non-magnetic layer opposite to another side on which the first magnetic layer is disposed or one side of the second non-magnetic layer opposite to another side on which the second magnetic layer is disposed.

22. The magnetoresistance effect element according to claim 21, wherein one of the two reference layers is an anti-parallel coupling reference layer.

23. The magnetoresistance effect element according to claim 21, further comprising
a first recording layer including the first and second magnetic layers,
a third reference layer disposed on one side of the first recording layer opposite to another side on which the first reference layer is disposed,
a second recording layer disposed on one side of the third reference layer opposite to another side on which the first magnetic layer is disposed.

24. A magnetic memory including, as a memory cell, the magnetoresistance effect element according to claim 1.

25. The magnetoresistance effect element according to claim 1, wherein the at least one 3d ferromagnetic transition metal element in each of the first and second magnetic layers includes one of Co, Fe, Ni, or Mn.

* * * * *